United States Patent
Dick

(10) Patent No.: US 7,528,679 B2
(45) Date of Patent: May 5, 2009

(54) CIRCUIT ARRANGEMENT FOR SHIFTING THE PHASE OF AN INPUT SIGNAL AND CIRCUIT ARRANGEMENT FOR SUPPRESSING THE MIRROR FREQUENCY

(75) Inventor: Burkhard Dick, Hamburg (DE)

(73) Assignee: NXP B.V., Eindhoven (NL)

( * ) Notice: Subject to any disclaimer, the term of this patent is extended or adjusted under 35 U.S.C. 154(b) by 826 days.

(21) Appl. No.: 10/508,456

(22) PCT Filed: Mar. 24, 2003

(86) PCT No.: PCT/IB03/01125

§ 371 (c)(1),
(2), (4) Date: Sep. 21, 2004

(87) PCT Pub. No.: WO03/081767

PCT Pub. Date: Oct. 2, 2003

(65) Prior Publication Data

US 2005/0152083 A1  Jul. 14, 2005

(30) Foreign Application Priority Data

Mar. 26, 2002 (DE) ................ 102 13 423

(51) Int. Cl.
*H03H 7/46* (2006.01)

(52) U.S. Cl. .................. 333/132
(58) Field of Classification Search ............. 333/126, 333/129, 132; 708/300
See application file for complete search history.

*Primary Examiner*—Benny Lee
*Assistant Examiner*—Kimberly E Glenn
(74) *Attorney, Agent, or Firm*—Peter Zawilski

(57) ABSTRACT

Circuit arrangement for shifting the phase of an input signal, which circuit arrangement consists of two branches whose two output signals are 90° phase-shifted, and use of this phase shifter in a circuit arrangement for suppressing the mirror frequency. The filter systems in the two branches of the phase shifter are implemented in such a way that the phase difference between these two branches is 90°, independent of the frequency of the input signal. In the mirror frequency circuit, a frequency band is amplified or blanked during transmission. The base frequency BF constitutes the center of the frequency band. The amplitude difference is small in the solutions according to the invention. The amplitude difference is improved when the two 90° phase-shifted signals are matched or substantially equalized as regards their amplitude. The matching is performed in that the two signals are rectified and subsequently subtracted from each other. The result is supplied to an integrator whose output signal, together with a reference signal, constitutes the control value. This results in a substantially ideal suppression of the mirror frequency. The circuit arrangement can be used in a radio or television receiver.

7 Claims, 16 Drawing Sheets

CIRCUIT ARRANGEMENT FOR SHIFTING THE PHASE OF AN INPUT SIGNAL AND CIRCUIT ARRANGEMENT FOR SUPPRESSING THE MIRROR FREQUENCY

The invention relates to a circuit arrangement for shifting the phase of an input signal. Circuit arrangements for phase shifting consist of two branches whose two output signals are 90° phase-shifted. The relative phase position with respect to the input signal is unimportant. For the further use of the output signals, it may be decisive that the phase shift should possibly be exactly 90° and that the amplitude difference is possibly small. There are prior-art circuit arrangements using all-pass filters. Dependent on the frequency of the input signal of an all-pass filter, the phase of the output signal is shifted by a given value. The amplitude of the output signal remains unchanged so that there is no attenuation. The drawback of such a prior-art arrangement is that it supplies exactly 90° phase-shifted output signals only for one or maximally two frequencies of the input signal. There are also prior-art circuit arrangements for phase shifting which consist of a low-pass filter, a high-pass filter or the combination of both. These circuit arrangements have the advantage that the two output signals are 90° phase-shifted for all frequencies of the input signal. However, they have the drawback that filtering by means of a low-pass filter or a high-pass filter involves an attenuation so that the output signal has a smaller amplitude than the input signal. For given subsequent applications, it may, however, be important that the amplitude is unchanged or is at least attenuated to a small extent only. The larger the amplitude difference, the more elaborate its compensation.

Phase shifters of the type described are used, for example, in circuits for suppressing the mirror frequency, which circuits are used in radio receivers. In this case, the input signal does not consist of a frequency but of a frequency band, i.e. a superposition of fundamental and harmonic waves which are a multiple of the fundamental waves. The RF-received signal is converted down to a lower frequency, referred to as the intermediate frequency. In a mixer stage, the input signal is multiplied with an oscillator signal. The modulation is then obtained. The intermediate frequency is mathematically found by subtracting the oscillator frequency from the input frequency and by differentiation. These arithmetical operations result in two frequency bands which are below and above the oscillator frequency and are superimposed in the intermediate frequency range. The frequency band to be received is denoted as the useful band while the other band is denoted as mirror band or as mirror frequencies. The mirror frequencies represent an interference value and should therefore be suppressed as satisfactorily as possible. By adjusting the oscillator frequency, which can be trimmed, the receiver frequency is selected. The center of the intermediate frequency band is denoted as base frequency.

Circuit arrangements in accordance with the prior art thus either have the drawback that the phase difference between the two output signals is 90° only for a given input frequency, or that the output signals have a strongly attenuated amplitude. This leads to limitations as regards the possibilities of using these known circuit arrangements for phase shifting and, in their actual applications, to results which are liable for improvement.

It is therefore an object of the invention to provide circuit arrangements for phase shifting which supply two 90° phase-shifted output signals for all frequencies of the input signal, which output signals are not attenuated or attenuated to a very small extent as compared to the amplitude of the input signal. It is another object of the invention to provide circuit arrangements for suppressing the mirror frequency, which have two 90° phase-shifted input signals and generate an adequate blanking for more than one frequency of the input signal. It is a further object of the invention to provide a control for equalizing two 90° phase-shifted input signals, which two input signals may be, for example, the output signals of a circuit arrangement for phase shifting or a mixer stage.

These objects are achieved by a plurality of variants of the invention.

In a first variant according to the invention, the input voltage is supplied on two parallel branches in which, in turn, two all-pass filters are arranged parallel to each other. The output voltage in the first branch is formed by the subtraction of the output signal of the second all-pass filter from the output signal of the first all-pass filter, or by the addition of the output signal of the first all-pass filter to the inverse output signal of the second all-pass filter. The output voltage of the second branch is formed by the addition of the output signals of the two all-pass filters.

In a further variant of the solution according to the invention, the input signal is again supplied on two parallel branches. A low-pass filter and a high-pass filter are arranged in parallel in the first branch and their output signals are combined via an adder, while the output signal of the high-pass filter is inverted. Two low-pass filters having different cut-off frequencies are arranged parallel to each other in the second branch. The output signals of the two low-pass filters are combined via an adder, while the signal of the low-pass filter having the higher cut-off frequency is inverted.

In a further variant of the invention, only filters of the same cut-off frequency are used. This leads to a simpler implementation of their use in combination with this circuit arrangement according to the invention. Since, moreover, only three filters are used, a space saving on the board or the integrated circuit is obtained. The input signal is again supplied on two branches. One branch incorporates only an all-pass filter with a cut-off frequency which corresponds to the base frequency of the input signal. The output signal of the first branch is tapped from this all-pass filter. The second branch incorporates, in arbitrary sequence, a high-pass filter, a low-pass filter and an amplifier element. Both the high-pass filter and the low-pass filter have a cut-off frequency $f_{45}$ which corresponds to the base frequency of the input signal.

A further solution according to the invention also has the advantage that only filters of the same cut-off frequency are used, in which solution only two filters are sufficient. The input signal is again supplied on two branches. One branch incorporates, consecutively, a low-pass filter and a high-pass filter as well as an amplifier element. The low-pass filter and the high-pass filter have the same cut-off frequency which corresponds to the base frequency of the input signal. The output signal of the low-pass filter is also tapped and supplied to an adder which is present in the first branch. An amplifier element having the factor of minus 0.5 is arranged before the adder in the other branch.

In a further variant of the solution according to the invention, the input signal is supplied on three parallel branches. One branch incorporates a low-pass filter having a cut-off frequency below the base frequency, and the other branch incorporates a low-pass filter having a cut-off frequency above the base frequency. An adder which also receives the inverse output signal of the low-pass filter having the higher cut-off frequency and whose output signal is applied to an amplifier element is arranged behind the low-pass filter having the lower cut-off frequency. The output signal of this amplifier element is the one output signal of the circuit arrangement and the other output signal of the circuit arrangement is formed by an adder which is fed with three input signals, namely the output signal from the low-pass filter having the lower cut-off frequency, the output signal from the low-pass filter having the higher cut-off frequency, and the inverse input signal.

A further variant of the invention improves the amplitude deviation generated by the filters in the branches by way of matching. According to the invention, in the circuit arrangement for amplitude matching, the one input signal is left unchanged and is only used for comparison, whereas the amplitude of the other signal is increased or decreased until there is no or only a minimal difference. The input signals either correspond to the output signals of a phase shifter or to the two branches of a mirror frequency suppression before these output signals are combined via an adder. For comparing the two sine-shaped signals, both signals are first rectified and subsequently subtracted from each other. The result is supplied to an integrator, whose output signal, together with a reference signal, forms the control value for the signal which is to be matched.

A further variant is the use of one of the circuit arrangements according to the invention in the case of frequency conversion as performed, for example, in a radio or a television receiver.

The invention will now be described with reference to the drawings. The following definitions are used.

| | |
|---|---|
| $U_{in}$ | input signal |
| $U_{out1}, U_{out2}$ | output signals phase-shifted by $\Delta\phi = 90°$, in which the phase position with respect to $U_{in}$ is unimportant. |
| $U_{in0}, U_{in90}$ | input signals having the same amplitude and the same frequency, in which the mutual phase shift is $|\Delta\alpha| = 90°$ |
| $U_{in0}$ and $U_{in90}$ | are generated in, for example, mixer stages, as is shown in FIG. 8. For the sake of clarity, they are generated by generators in FIGS. 9 to 14. |
| $U_{out3}, U_{out4}$ | output signals whose mutual phase position is $\Delta\phi = 180°$, in which the phase position with respect to $U_{in0}$ and $U_{in90}$ is unimportant. |
| $U_0, U_1, \ldots U_5$ | signals for the amplitude matching |
| $R_1, R_2$ | rectifiers |
| I | integrator |
| BF | base frequency = center frequency of the ZF band |
| ZF | intermediate frequency of $U_{in0}$ and $U_{in90}$ at which they are down-converted, for example, in a mixer stage |
| $TP_1$ | low-pass filter with a cut-off frequency $f_{45}$ below the base frequency BF |
| $TP_2$ | low-pass filter with a cut-off frequency $f_{45}$ above the base frequency BF |
| $TP_3$ | low-pass filter with a cut-off frequency $f_{45}$ corresponding to the base frequency BF |
| $HP_1$ | high-pass filter with a cut-off frequency $f_{45}$ below the base frequency BF |
| $HP_2$ | high-pass filter with a cut-off frequency $f_{45}$ above the base frequency BF |
| $HP_3$ | high-pass filter with a cut-off frequency $f_{45}$ corresponding to the base frequency BF |
| $AP_1$ | all-pass filter with a cut-off frequency $f_{90}$ below the base frequency BF |
| $AP_2$ | all-pass filter with a cut-off frequency $f_{90}$ above the base frequency BF |
| $AP_3$ | all-pass filter with a cut-off frequency $f_{90}$ corresponding to the base frequency BF |
| $V_i$ | amplifier elements 1 to i with a gain A: |
| $V_1$ | $A \geq 2$ |
| $V_2$ | $A = -0.5$ |
| $V_3$ | $A \geq 1$ |
| $V_4$ | $A = 0.5$ |
| $MS_1$ | mixer stage in which the input signal with a sine function is mixed |
| $MS_2$ | mixer stage in which the input signal with a cosine function is mixed |
| $\phi$ | phase shift caused by the filters |
| $\Delta\alpha$ | phase difference between $U_{in0}$ and $U_{in90}$, caused by down-conversion. $\Delta\alpha$ may be +90° or −90°. The sign is dependent on whether $U_{in0}$ or $U_{in90}$ is leading or trailing. |
| $|\Delta\alpha| = 90°$ | condition for using the circuit arrangement for phase shifting according to the invention as a circuit arrangement for suppressing the mirror frequency |
| $f_0$ | oscillator frequency $\omega_0 = 2\pi f_0$ |
| URF | voltage radio frequency = RF voltage |
| X | branching point for $U_{in0}$ |
| Y | branching point for $U_{in90}$ |
| Z | branching point for $U_{in}$ |
| G | generator as an example of generating a signal of the described frequency, for the phase shift it may be the signal received from an antenna, for example, an output signal of the phase shifter or a mixer stage for the mirror frequency suppression. |

Concerning the prior art, FIGS. 1 and 2 show circuit arrangements for phase shifting, FIGS. 8 and 9 show circuit arrangements for mirror frequency suppression.

Solutions for phase shifting according to the invention are shown in FIGS. 3, 4, 5, 6 and 7.

Solutions for mirror suppression according to the invention are shown in FIGS. 8, 9, 10, 11, 12, 13 and 14.

Figure 1:
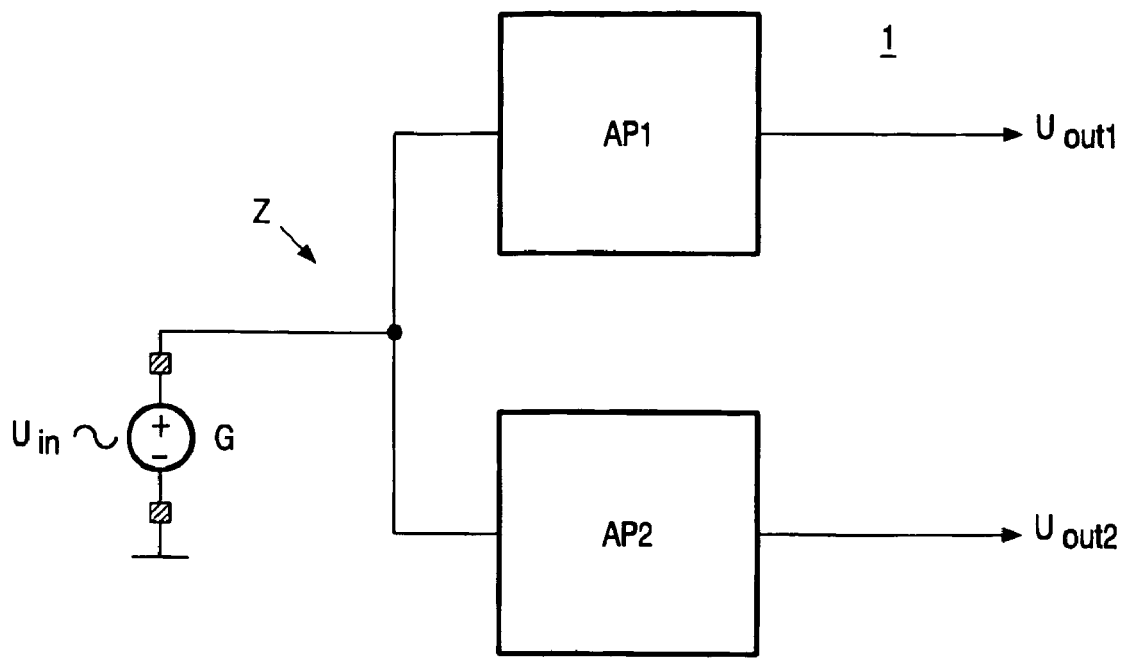
Figure 2:
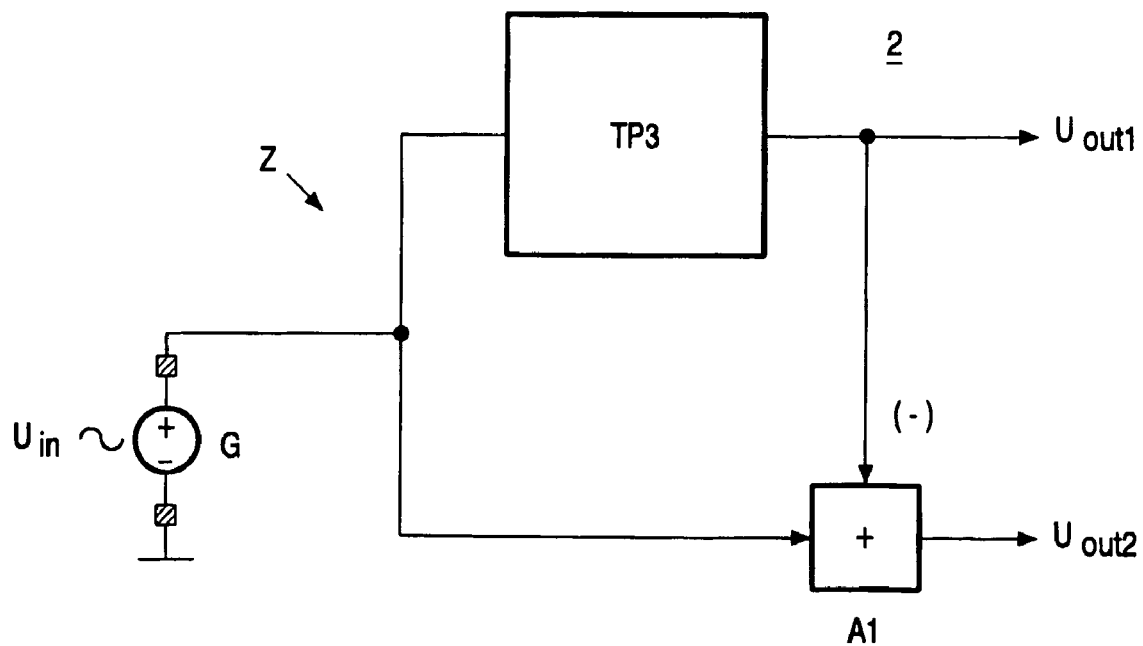
Figure 16:
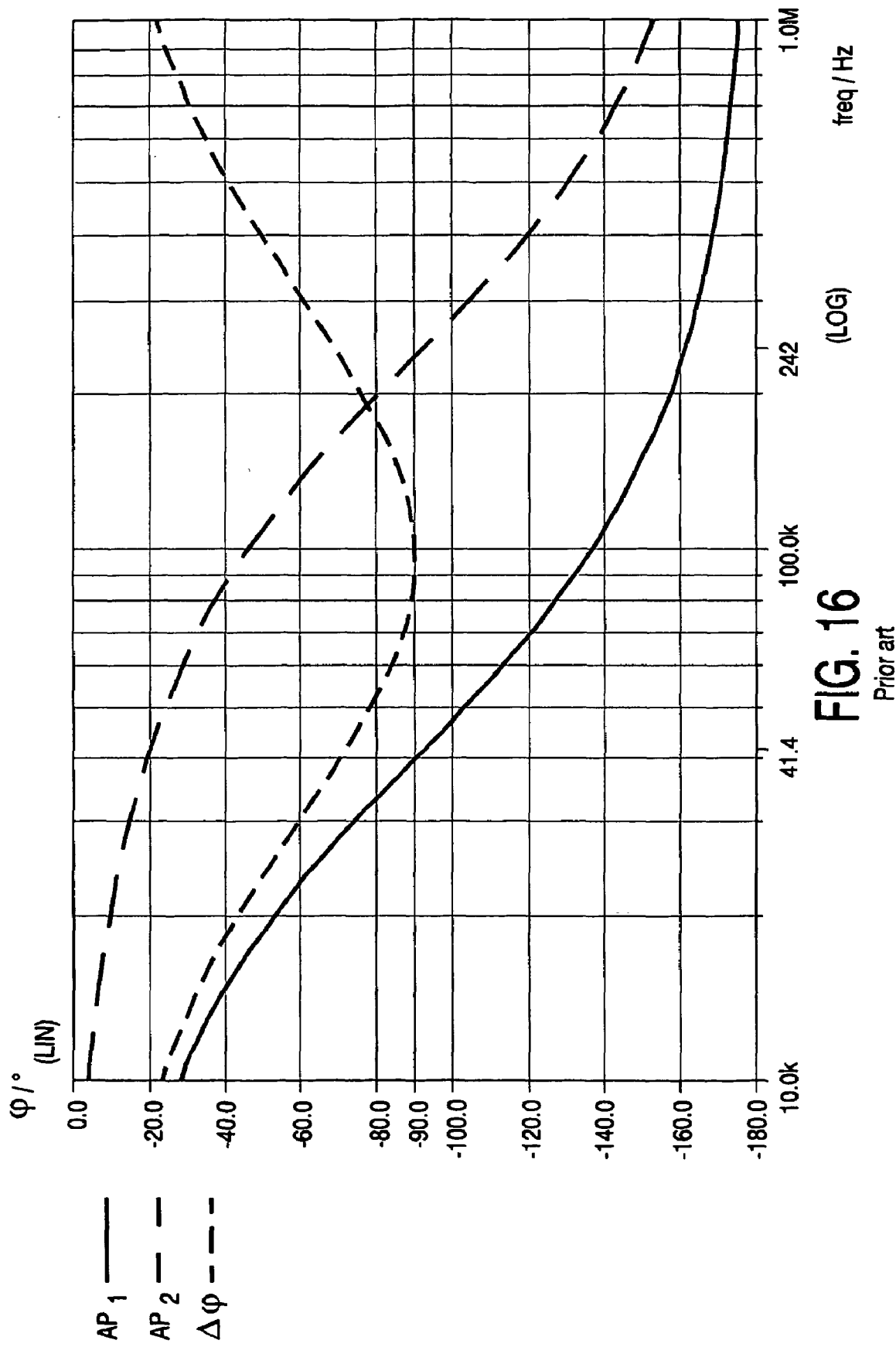
FIG. 16 is a prior-art diagram with the phase difference which reaches the value of minus 90° only once and FIG. 17 is a diagram showing a phase difference which reaches the value of minus 90° twice.
Figure 17:
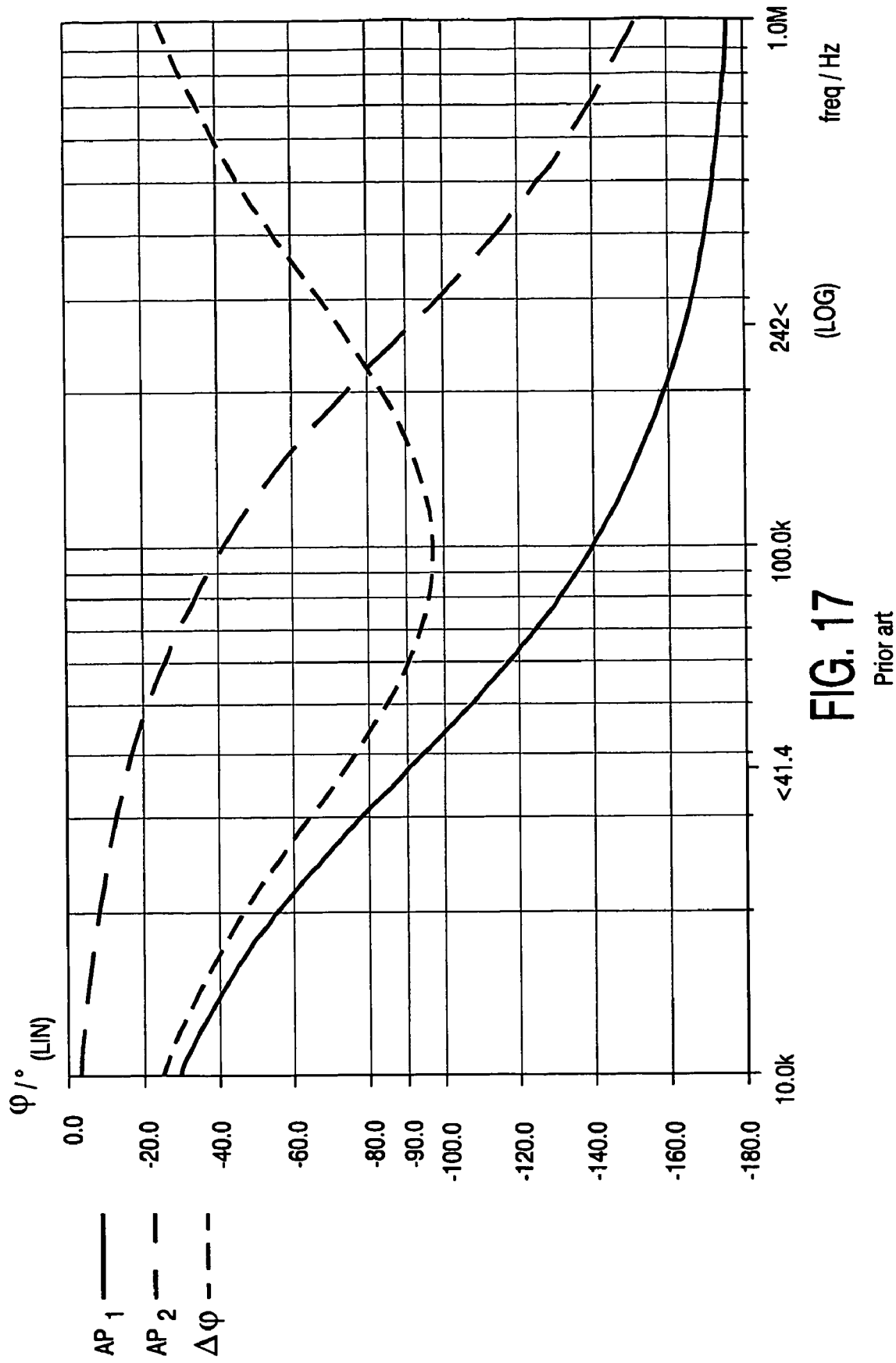

FIG. 1 shows a prior-art circuit arrangement 1 for phase shifting, constituted by two all-pass filters $AP_1$, $AP_2$. The input signal $U_{in}$ is supplied on two parallel branches via a branching point Z. One branch comprises an all-pass filter $AP_1$, whose cut-off frequency $f_{90}$ is below the base frequency BF, i.e. the center frequency of the frequency band, and the other branch comprises an all-pass filter $AP_2$ whose cut-off frequency $f_{90}$ is above the base frequency BF. If the input signal $U_{in}$ has the above-mentioned base frequency BF, the output signals of the two all-pass filters $U_{out1}$ and $U_{out2}$ are phase-shifted by exactly 90° to each other. In FIG. 16, a value of 100 kHz is taken as the base frequency. It can be seen how the function $\Delta\phi$ is described by subtraction of $AP_2$ from $AP_1$ and reaches the value $\phi$=minus 90° exactly once. This means that already a minor detuning of the generator G generating the input voltage $U_{in}$ away from the base frequency BF leads to the fact that the two output signals $U_{out1}$ and $U_{out2}$ are no longer vectorially orthogonal to each other. For given, subsequent uses it may, however, be necessary that the phase distance for a plurality of frequencies above and/or below the base frequency BF is 90°. It is known from the prior art that the circuit arrangement 1 shown in FIG. 1 is implemented in such a way that the phase shift is 90° for two frequencies. The corresponding transfer function is shown in FIG. 17. The cut-off frequency $f_{90}$ of the first all-pass filter $AP_1$ is shifted towards smaller frequencies and the cut-off frequency $f_{90}$ of the second all-pass filter $AP_2$ is shifted towards higher frequencies. With the known circuit arrangement 1 as shown in FIG. 1, a phase shift of 90° is thus possible for maximally two frequencies from the frequency band of the input signal $U_{in}$. The advantage of this circuit arrangement 1 consisting of all-pass filters is that the two output signals $U_{out1}$ and $U_{out2}$ have the same amplitude as the input signal $U_{in}$, i.e. there is no amplitude difference between $U_{out1}$ and $U_{out2}$ The prior art also represents a circuit arrangement 2 as shown in FIG. 2. In this arrangement, the input signal $U_{in}$ is again supplied at the branching point Z on two branches. One branch comprises a low-pass filter $TP_3$ with a cut-off frequency $f_{45}$ corresponding to the base frequency BF, and the other branch comprises an adder $A_1$. The first input signal of the adder $A_1$ is $U_{in}$, the second input signal is the inverse output signal of the low-pass filter $TP_3$ from the first branch. $U_{out1}$ is the output signal of the low-pass filter $TP_3$ and $U_{out2}$ is the output signal of the adder $A_1$. In this circuit arrangement 2, $\Delta\phi$ is equal to 90° for all frequencies of $U_{in}$.

$$U_{out1} = TP_3 * U_{in} = \frac{1}{(1 + j\omega c)} * U_{in} \quad (1)$$

$$U_{out2} = (1 - TP_3) * U_{in} = 1 - \frac{1}{(1 + j\omega c)} * U_{in} = \frac{j\omega c}{(1 + j\omega c)} + U_{in} \quad (2)$$

with
$\omega = 2\pi f$
$c = R_3 * C_3$

For the same denominator, the numerator of equation (1) is purely real whereas it is purely imaginary in equation (2).

Figure 18:
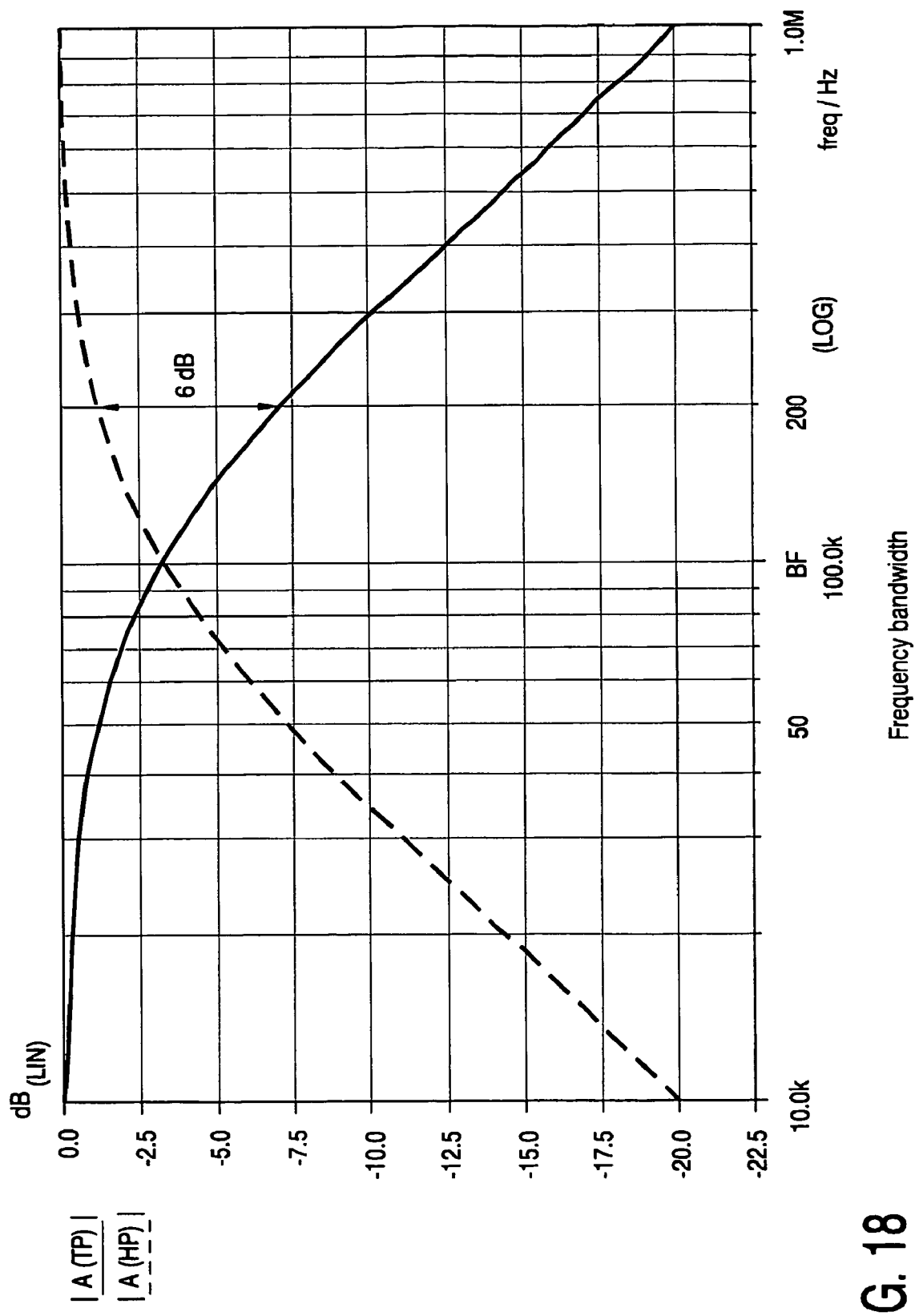
FIG. 18 is a prior-art diagram showing the amplitude characteristic of a high-pass filter and a low-pass filter.

However, the amplitude characteristic behaves in the way shown in FIG. 18. In this circuit arrangement 2, the two output signals only have the same amplitude when $U_{in}$ exactly has the base frequency BF which also corresponds to the cut-off frequency $f_{45}$ of the low-pass filter. However, it may be important for subsequent uses that the amplitudes do not deviate from each other or at least deviate minimally. If it is assumed that a minor amplitude difference is acceptable for the subsequent uses, the circuit arrangement 2 shown in FIG. 2 yields a given frequency range above and below the base frequency BF. FIG. 18 shows the frequency band whose amplitude deviation is below 6 dB. Starting from a base frequency BF of 100 kHz, a frequency bandwidth of 150 kHz is obtained for this circuit arrangement 2.

Figure 3:
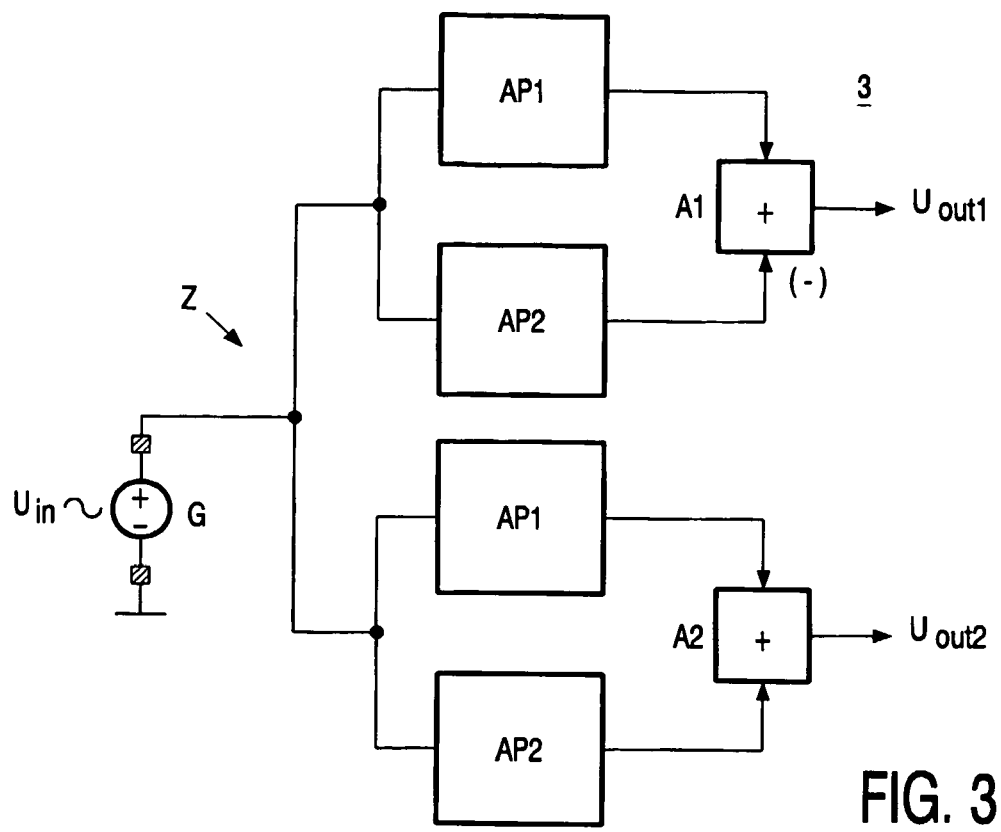

As a variant of the solution according to the invention, FIG. 3 shows a circuit arrangement 3. The input voltage $U_{in}$, is supplied at the branching point Z on two parallel branches in which again the two all-pass filters $AP_1$ and $AP_2$ are arranged parallel to each other. The output voltage $U_{out1}$ is generated by the subtraction of the output signal of the all-pass filter $AP_2$ from the output signal of the all-pass filter $AP_1$, or by the addition of the output signal of all-pass filter $AP_1$ and the inverse output signal of all-pass filter $AP_2$ (adder $A_1$). The output voltage $U_{out2}$ is generated by addition of the output signals of the all-pass filter $AP_1$ and the all-pass filter $AP_2$ in the second branch (adder $A_2$). Similarly as in the prior art as shown in FIG. 2, a phase shift of 90° between the output voltage $U_{out1}$ and the output voltage $U_{out2}$ is generated for all frequencies. However, it can be seen from the amplitude characteristic shown in FIG. 19 that the amplitude deviation is smaller, namely only about 2 dB, in a frequency band having the same width as in the prior art shown in FIG. 2, i.e. in the example of 150 kHz. In other words, for a chosen admissible amplitude deviation of 6 dB, the frequency band is wider, namely 346 kHz in the case shown.

Arithmetically, it can be proved that the phase difference for all input frequencies is 90°. The all-pass filters $AP_1$ and $AP_2$ are then described by the following equations (3) and (4)

$$AP_1 = \frac{(1 - j\omega a)}{(1 + j\omega a)} \quad (3)$$

$$AP_2 = \frac{(1 - j\omega b)}{(1 + j\omega b)} \text{ with} \quad (4)$$

$\omega = 2\pi f$
$a = R_1 * C_1$
$b = R_2 * C_2$

Equation (5) for the output voltage $U_{out1}$ then is:

$$U_{out1} = (AP_1 - AP_2) * U_{in} = \frac{2j\omega(b - a)}{(1 + j\omega a)(1 + j\omega b)} * U_{in} \quad (5)$$

The following equation (6) holds for the output voltage $U_{out2}$:

$$U_{out2} = (AP_1 + AP_2) * U_{in} = \frac{2(1 + \omega a\omega b)}{(1 + j\omega a)(1 + j\omega b)} * U_{in} \quad (6)$$

Equations (5) and (6) fulfill the criteria for the proof that the output voltages $U_{out1}$ and $U_{out2}$ are 90° phase-shifted with respect to each other for all frequencies of the input voltage $U_{in}$. The prevailing criteria then are: the denominator of the two equations (5) and (6) are equal and one numerator is purely imaginary (in this case the numerator of equation (5)) and the other numerator is purely real (in this case equation (6)). For the all-pass filter $AP_1$, a cut-off frequency $f_{90}$ below the base frequency BF of the input signal $U_{in}$ is preferably chosen, whereas a cut-off frequency $f_{90}$ above the base frequency BF is preferably chosen for the all-pass filter $AP_2$. Advantageously, the two all-pass filters are implemented in such a way that the cut-off frequency $f_{90}$ of all-pass filter $AP_1$ is 41.4 kHz and that of all-pass filter $AP_2$ is 242 kHz at the base frequency of 100 kHz as chosen for this embodiment.

Figure 19:
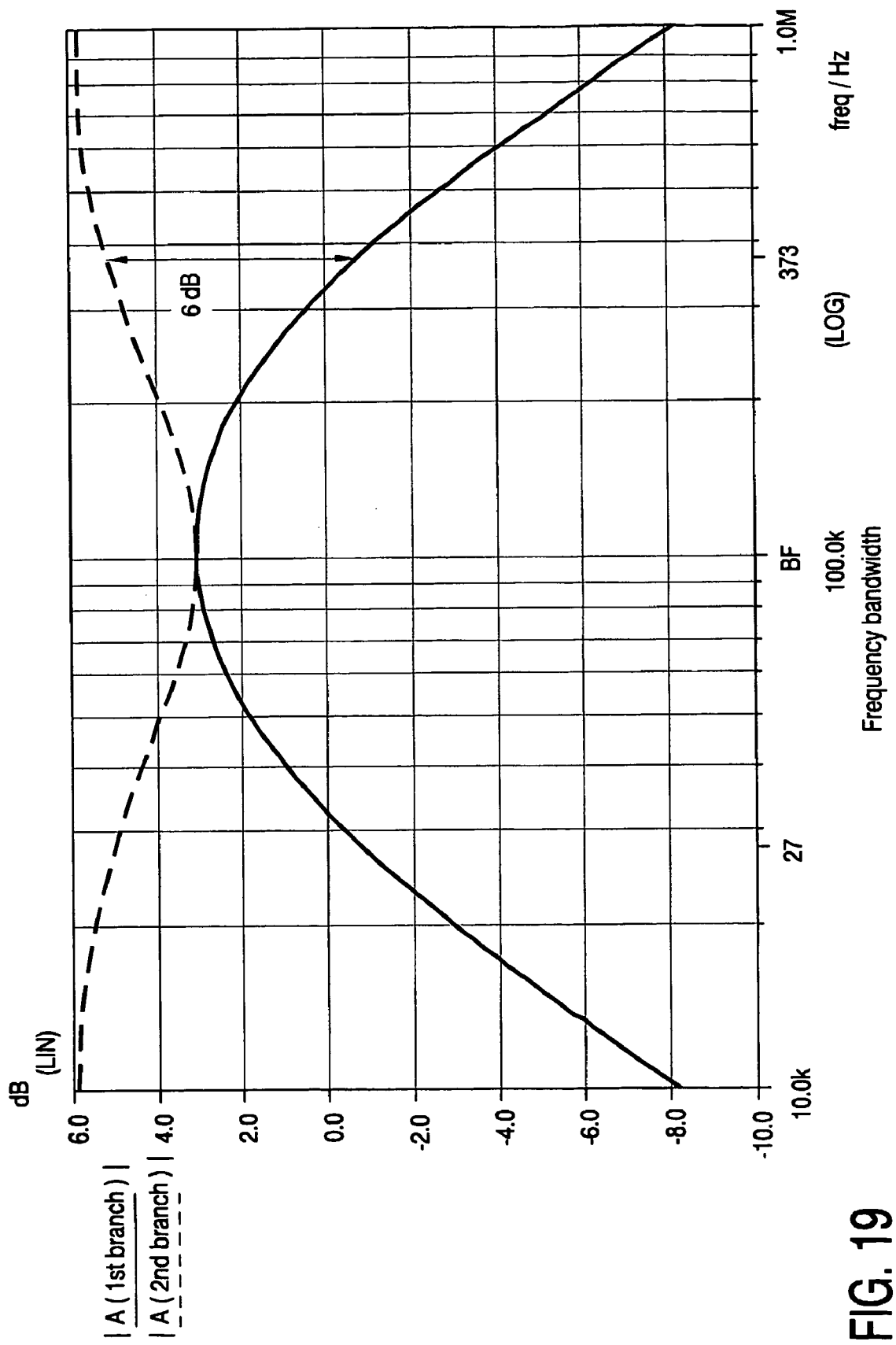
FIG. 19 is a diagram showing the amplitude characteristic of a solution according to the invention.

The amplitude characteristic is shown in FIG. 19.

Figure 4:
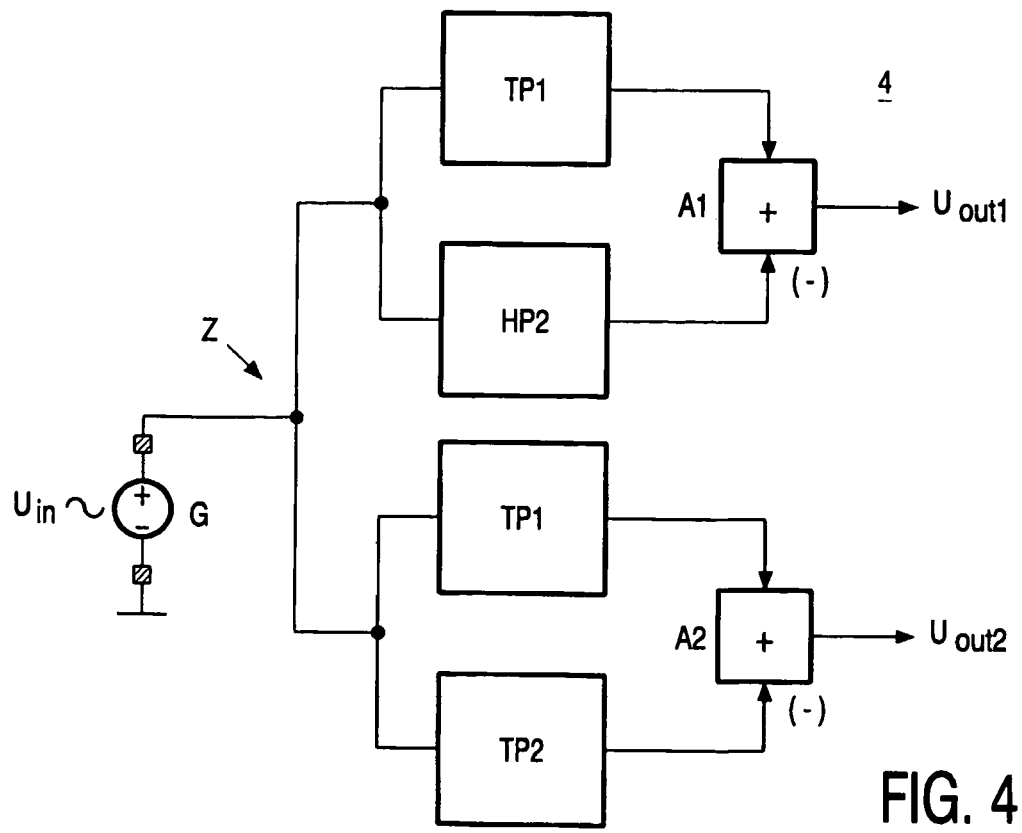

As a further variant of the solution according to the invention, FIG. 4 shows a circuit arrangement 4. The input signal $U_{in}$, is again supplied at the branching point Z on two branches. A low-pass filter $TP_1$ and a high-pass filter $HP_2$ are arranged parallel to each other in the first branch and their output signals are combined via an adder $A_1$, the output signal of the high-pass filter $HP_2$ being inverted in advance. In other words, the output signal $U_{out1}$ is generated by subtraction of the output signal of the high-pass filter $HP_2$ from the output signal of the low-pass filter $TP_1$. A low-pass filter $TP_1$ and a low-pass filter $TP_2$ are arranged parallel to each other in the second branch. The output signal $U_{out2}$ is generated by subtraction of the output signal of the low-pass filter $TP_2$ from the output signal of the low-pass filter $TP_1$ (adder $A_2$). In other words, the output signals of the low-pass filters $TP_1$ and $TP_2$ are combined via an adder, while the output signal of low-pass filter $TP_2$ is inverted in advance. The amplitude difference between the output signals in this solution according to the invention is equal to the amplitude difference in the solution shown in FIG. 3. The amplitude characteristic is shown in FIG. 19. The proof that the output signals $U_{out1}$ and $U_{out2}$ are 90° phase shifted with respect to each other for all frequencies of the input signal $U_{in}$, is again given arithmetically. Accordingly, the definitions of the filters are as follows:

$$TP_1 = \frac{1}{(1 + j\omega a)} \tag{7}$$

$$TP_2 = \frac{1}{(1 + j\omega b)} \tag{8}$$

$$HP_2 = \frac{j\omega b}{(1 + j\omega b)} \text{ with} \tag{9}$$

$$\omega = 2\pi f$$
$$a = R_1 * C_1$$
$$b = R_2 * C_2$$

The following equation (10) is obtained for the output signal $U_{out1}$:

$$U_{out1} = (TP_1 - HP_2) * U_{in} = \frac{(1 + \omega a \omega b)}{(1 + j\omega a)(1 + j\omega b)} * U_{in} \tag{10}$$

The output signal $U_{out2}$ is described by the following equation (11):

$$U_{out2} = (TP_1 - TP_2) * U_{in} = \frac{j\omega(b - a)}{(1 + j\omega a)(1 + j\omega b)} * U_{in} \tag{11}$$

Also for this solution according to the invention, equations (10) and (11) show that the criteria for a constant phase shift between the output signals $U_{out1}$ and $U_{out2}$ are fulfilled: the denominators are equal and the one numerator (equation (10)) is purely real, whereas the other numerator (equation (11)) is purely imaginary.

Figure 5:
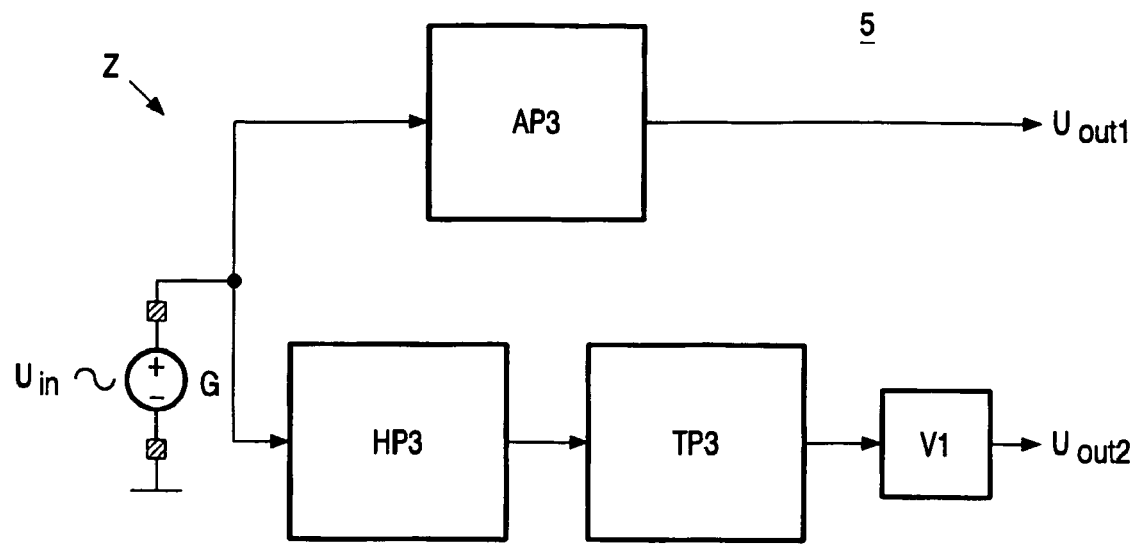
Figure 20:
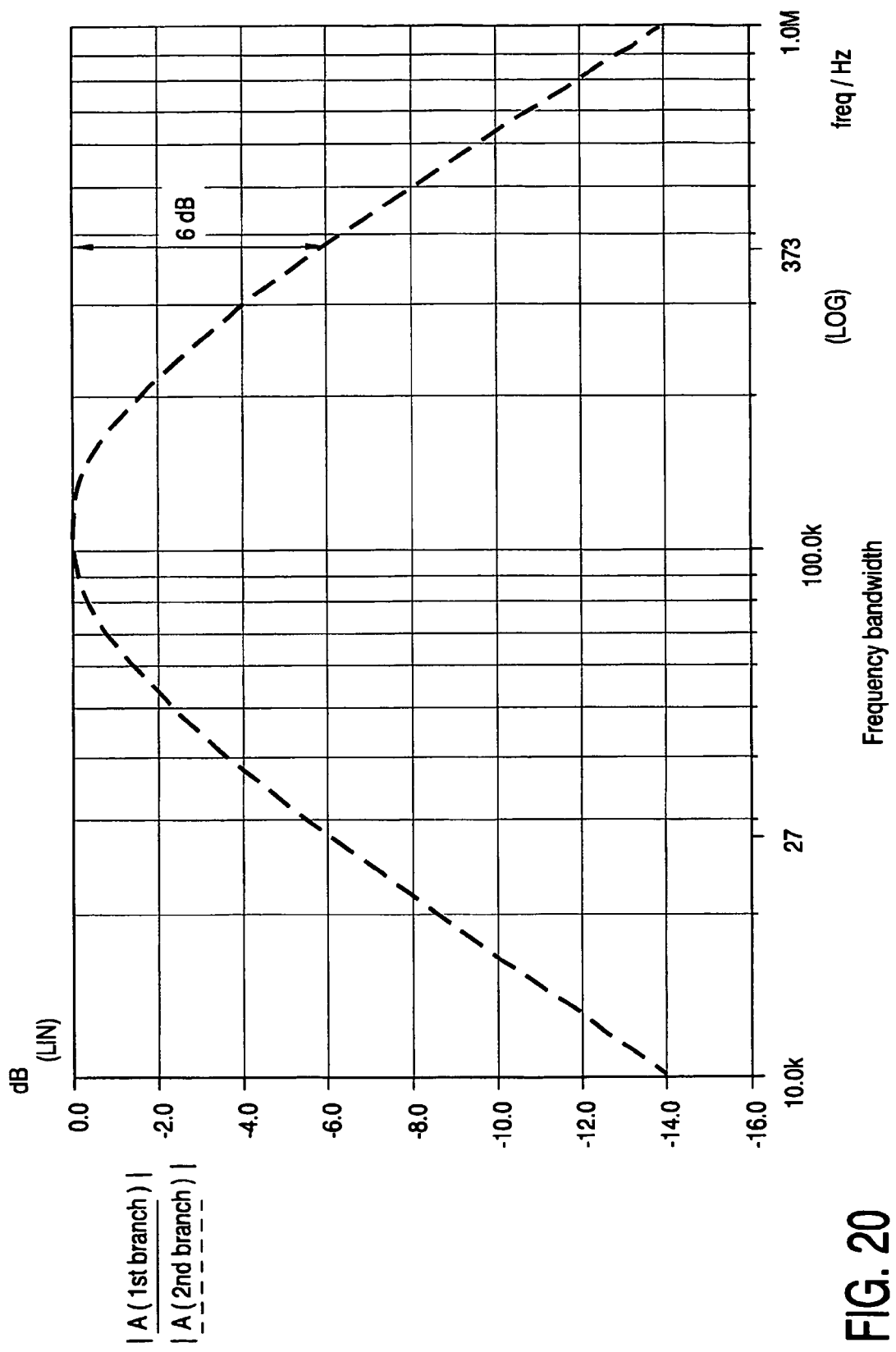
FIG. 20 is the diagram of the amplitude characteristic of another variant of the solution according to the invention.

As a further variant of the solution according to the invention, FIG. 5 shows a circuit arrangement 5. This circuit arrangement 5 has the advantage that only filters having the same cut-off frequency are used. This leads to a simple implementation of the circuit arrangement according to the invention. It has the additional advantage that only three filters are used so that this saves space on the board or in the integrated circuit. The input voltage $U_{in}$ is supplied on a first branch which consists only of an all-pass filter $AP_3$ which has a cut-off frequency $f_{90}$ corresponding to the base frequency BF and whose output signal is directly the output signal $U_{out1}$. Moreover, the input signal $U_{in}$ is supplied on a second branch which, in an arbitrary sequence, consecutively comprises a high-pass filter $HP_3$ with a cut-off frequency $f_{45}$ corresponding to the base frequency BF, a low-pass filter $TP_3$ with a cut-off frequency $f_{45}$ corresponding to the base frequency BF and an amplifier element $V_1$. The amplifier element $V_1$ has a value A of $\geq 2$. The associated amplitude characteristic of the output signals $U_{out1}$ and $U_{out2}$ is shown in FIG. 20. The frequency band which is determined by the maximally admissible amplitude difference of 6 dB at its upper and lower end, is also 346 kHz in this embodiment.

For the circuit arrangement 5 shown in FIG. 5, equations (15) and (16) for the output signals $U_{out1}$ and $U_{out2}$ with the filters are as follows:

$$AP_3 = \frac{(1 - j\omega c)}{(1 + j\omega c)} \tag{12}$$

$$HP_3 = \frac{j\omega c}{(1 + j\omega c)} \tag{13}$$

$$TP_3 = \frac{1}{(1 + j\omega c)} \tag{14}$$

with $c = R_3 * C_3$ $$U_{out1} = AP_3 * U_{in} = \frac{(1 + \omega c \omega c)}{(1 + j\omega c)(1 + j\omega c)} * U_{in} \tag{15}$$

$$U_{out2} = 2 * TP_3 * HP_3 * U_{in} = \frac{2j\omega c}{(1 + j\omega c)(1 + j\omega c)} * U_{in} \tag{16}$$

für $A = 2$

The respective amplitude characteristic is shown in FIG. 20.

Figure 6:
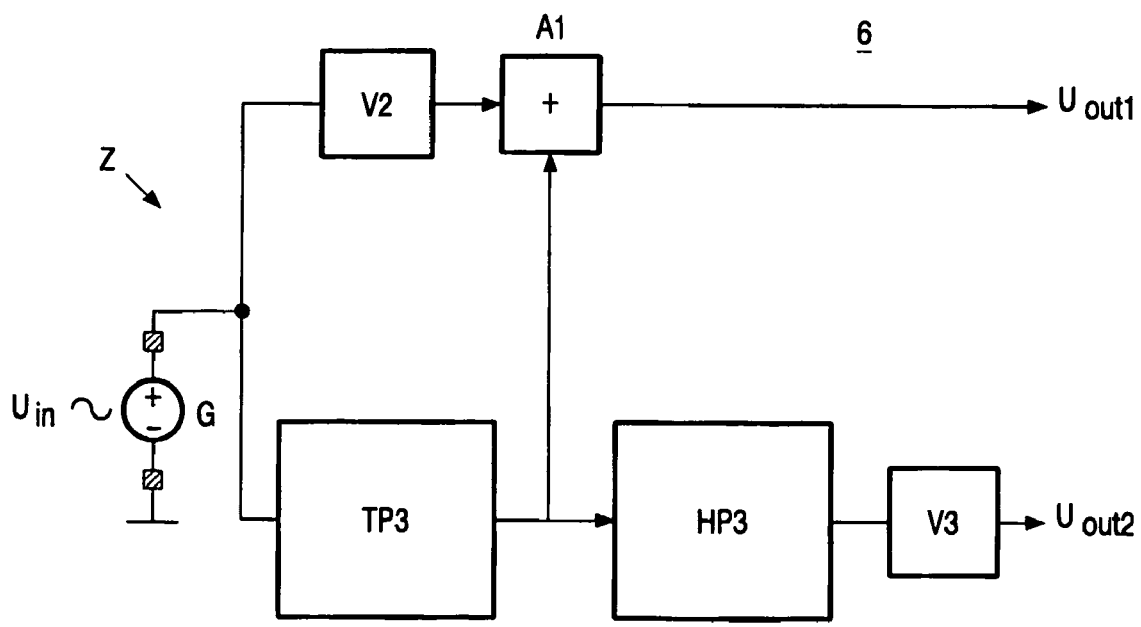

The circuit arrangement 6 according to the invention, shown in FIG. 6, is derived from equations (15) and (16) in that the all-pass filter $AP_3$ in equation (15) is substituted by:

$$\frac{1}{2} * AP_3 = -0.5 + TP_3 \tag{17}$$

The input signal $U_{in}$ is again supplied at the branching point Z on two branches. A low-pass filter $TP_3$ and a high-pass filter $HP_3$ as well as an amplifier element $V_3$ are arranged consecutively in one branch. The low-pass filter $TP_3$ and the high-pass filter $HP_3$ have the same cut-off frequency $f_{45}$ which corresponds to the base frequency BF. The output signal of the low-pass filter $TP_3$ is also tapped and applied to an adder $A_1$ which is present in the first branch. An amplifier element $V_2$ is arranged before the adder $A_1$ in the other branch.

Equations (18) and (19) for the output voltages $U_{out1}$ and $U_{out2}$ are as follows for a gain A=1 for $V_3$:

$$U_{out1} = (-0.5 + TP_3) * U_{in} = \frac{(1 + \omega c \omega c)}{2(1 + j\omega c)(1 + j\omega c)} * U_{in} \tag{18}$$

$$U_{out2} = TP_3 * HP_3 * U_{in} = \frac{j\omega c}{(1 + j\omega c)(1 + j\omega c)} * U_{in} \tag{19}$$

Also in this circuit arrangement 6 according to the invention, the criteria for the constant phase shift of 90° are fulfilled, namely that the denominators are equal and one numerator (equation (18)) is purely real and the other numerator (equation (19)) is purely imaginary. The amplitude characteristic is shown in FIG. 20.

Figure 7:
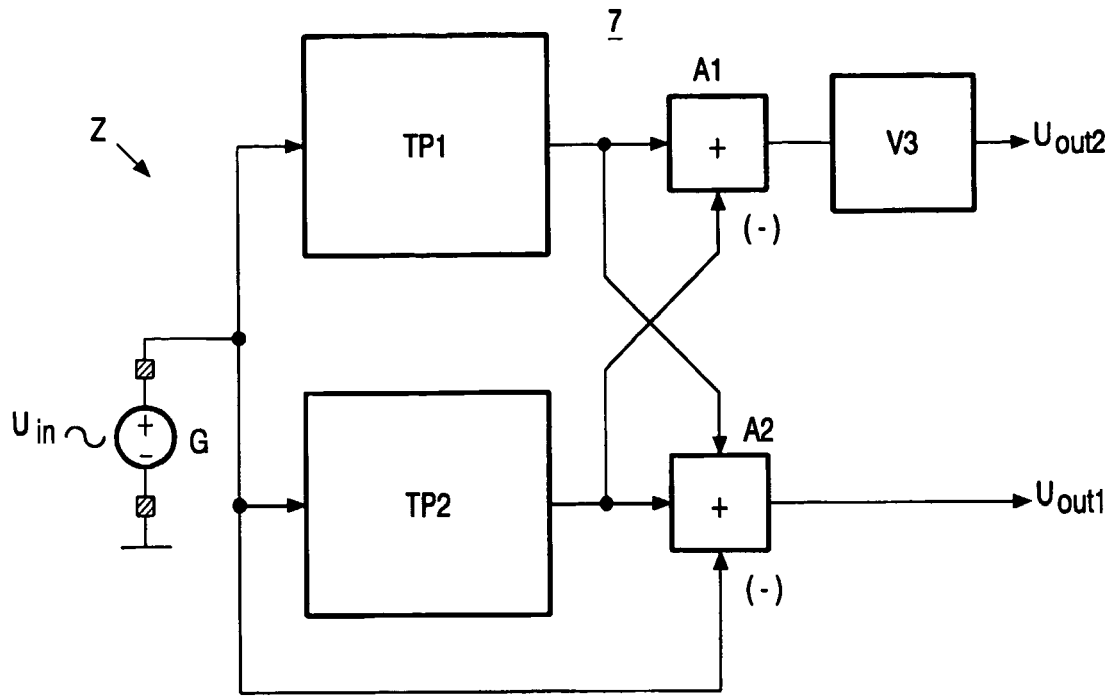

The circuit arrangement 7 according to the invention, shown in FIG. 7 is derived from the circuit arrangement shown in FIG. 4, in which the high-pass filter $HP_2$ is substituted by the following equation (20):

$$HP_2 = 1 - TP_2 \tag{20}$$

In this variant, the input signal is supplied on three parallel branches. One branch incorporates a low-pass filter $TP_1$ having a cut-off frequency $f_{45}$ below the base frequency BF, while the other branch incorporates a low-pass filter $TP_2$ having a cut-off frequency $f_{45}$ above the base frequency BF. An adder $A_1$, which is also fed with the inverse output signal of the low-pass filter $TP_2$ and whose output signal is applied to an amplifier element $V_3$, is arranged behind the low-pass filter $TP_1$. The output signal of this amplifier element $V_3$ is the one output signal of the circuit arrangement, while the other output signal of the circuit arrangement is formed by an adder $A_2$ which is fed with three input signals, namely the output signal of the low-pass filter $TP_1$, the output signal of the low-pass filter $TP_2$ and the inverse input signal $U_{in}$.

The following equations are obtained for the output signals $U_{out1}$ and $U_{out2}$ in FIG. 7:

$$U_{out1} = (TP_1 - HP_2) * U_{in} = \qquad (21) = (10)$$
$$(TP_1 - (1 - TP_2)) * U_{in} = \frac{(1 + \omega a \omega b)}{(1 + j\omega a)(1 + j\omega b)} * U_{in}$$

$$U_{out2} = (TP_1 - TP_2) * U_{in} = \frac{j\omega(b - a)}{(1 + j\omega a)(1 + j\omega b)} * U_{in} \qquad (22) = (11)$$

It can clearly be seen that, after the conversion, equations (21) and (22) correspond to equations (10) and (11) in FIG. 4 (amplitude characteristic in FIG. 19). For the circuit arrangement according to the invention, shown in FIG. 7, the criteria for the constant phase shift of 90° are thus also given.

Figure 8:
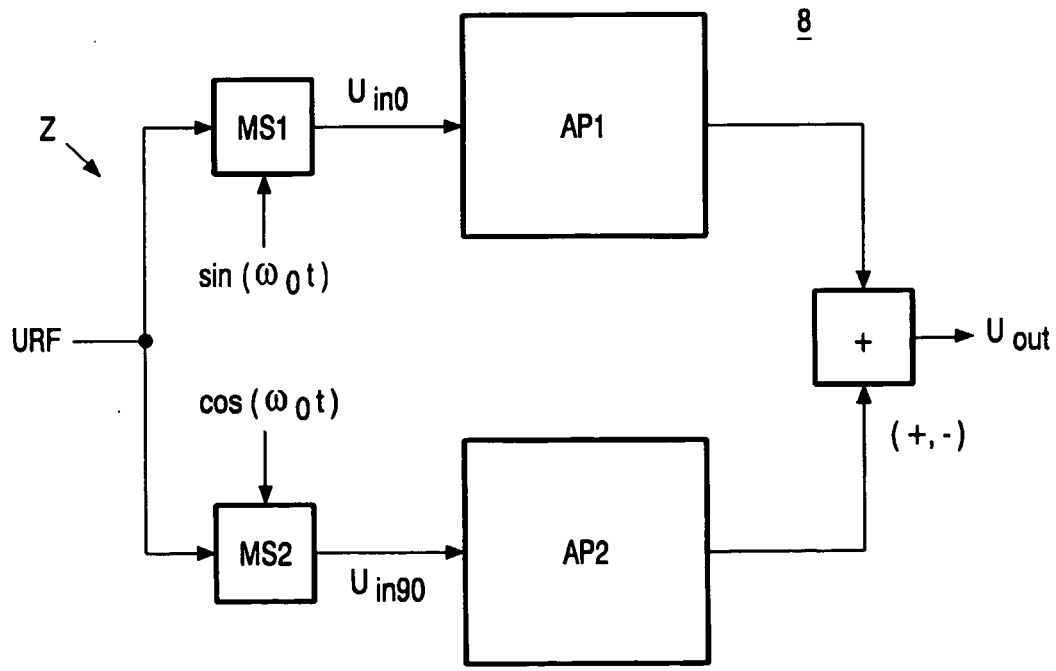

FIGS. 8 to 14 relate to circuit arrangements for phase shifting, in which, in comparison with the previous Figures, the branching point Z is cut off and the two parallel branches are fed with input signals which are already shifted with respect to each other because the value of the phase difference is 90°. This means that $U_{in0}$ and $U_{in90}$ are signals of the same frequency and the same amplitude but have a different phase position. Signals of this type may be generated, for example, as shown in FIG. 8, when down-converting RF reception signals to a lower intermediate frequency. The RF reception signal URF is applied to the input of a first mixer stage $MS_1$. Additionally, this mixer stage receives the oscillator signal, which is in phase, and forms the output signal $U_{in0}$ by multiplication. $U_{in0}$ has the same modulation as the received signal but a lower intermediate frequency ZF. The second branch comprises a second mixer stage $MS_2$ which, in addition to the input signal URF, receives the 90° phase-shifted oscillator signal of the same oscillator frequency. The output signal $U_{in90}$ is formed by multiplication and has also the same modulation as the received signal URF but a lower intermediate frequency ZF. Independent of the frequency of the received signal, the phase difference behind the mixer stages is always 90°. The amplitude remains unchanged and is the same for $U_{in0}$ and $U_{in90}$. This results from the multiplication by a sine and a cosine signal in the respective mixer stage.

The phase difference is formed in the following way.
For
$$U_{in0} = |U_{in0}| * \cos\phi$$
and
$$U_{in90} = |U_{in90}| * \sin\phi$$

$U_{in90}$ is phase-shifted by −90° with respect to $U_{in0}$.
For
$$U_{in0} = |U_{in0}| * \cos\phi$$
and
$$U_{in90} = |U_{in90}| * \sin(-\phi)$$

$U_{in90}$ is phase-shifted by +90° with respect to $U_{in0}$.

The input signals $U_{in0}$ and $U_{in90}$ which are already 90° shifted in phase are shifted in phase by a further 90° in the circuit arrangements shown in the Figures so that an output signal $U_{out3}$ and a further output signal $U_{out4}$ are obtained which are shifted 180° in phase with respect to each other. The phase position of the two output signals with respect to $U_{in}$, $U_{in0}$ or $U_{in90}$ is unimportant. They are combined by means of an adder or subtracter and form the output signal $U_{out}$ of the mirror suppression circuit. Dependent on whether an addition or a subtraction is performed and whether $U_{in90}$ is shifted plus or minus 90° in phase with respect to $U_{in0}$, $U_{out}$ corresponds to the amplified $U_{in}$ (see FIG. 15) or to the blanked $U_{in}$, (see FIG. 21 or 22).

FIG. 8 shows an application of the circuit arrangement 1 for phase shifting as shown in FIG. 1 in accordance with the prior art. In the circuit arrangement 8 shown in FIG. 8, the input signal VRF is supplied at the branching point Z on two branches in which it is initially mixed with an oscillator signal $\sin(\omega_o t)$, $\cos(\omega_o t)$. As described with reference to FIG. 1, the circuit arrangement 8 has the drawback that output signals $U_{out3}$ and $U_{out4}$ with a phase difference of 180° can be generated only for one or maximally two intermediate frequencies ZF. See FIGS. 16 and 17.

Figure 9:
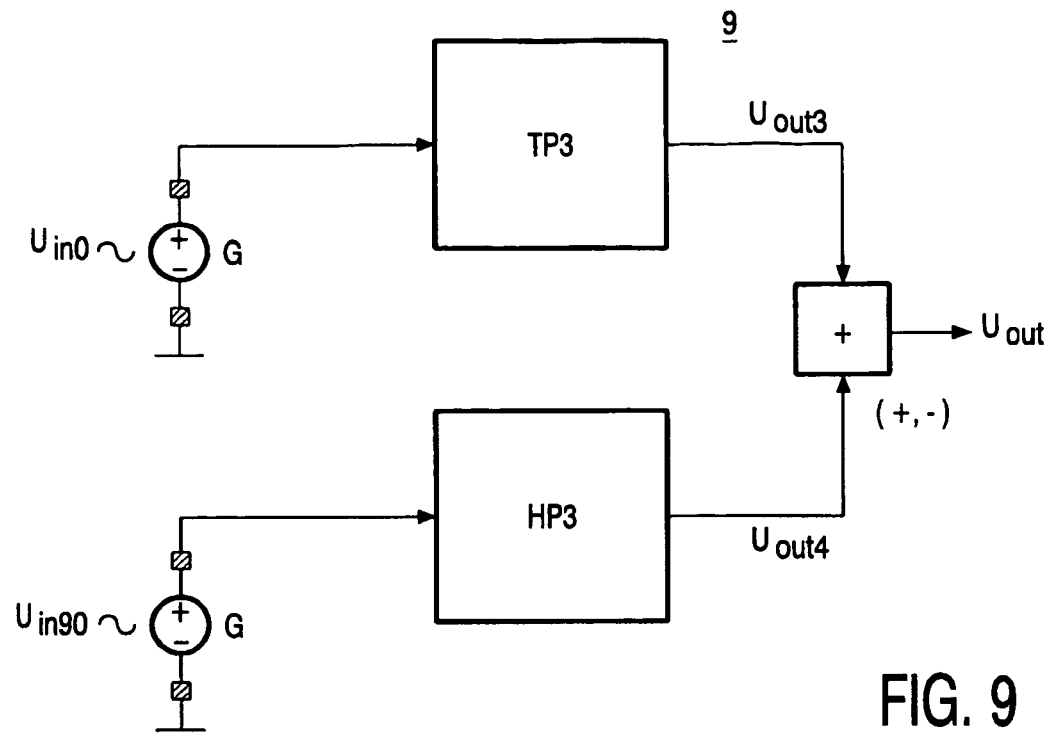

FIG. 9 shows an application of the circuit arrangement 2 as shown in FIG. 2 in accordance with the prior art. As is elucidated with reference to FIG. 2, circuit arrangement 9 shown in FIG. 9 generates a phase shift of 180° between the signals $U_{out3}$ and $U_{out4}$ for all intermediate frequencies ZF, but the amplitude is strongly attenuated as compared with the input signal and is equally large for $U_{out3}$ and $U_{out4}$ only for the base frequency BF. Equations (23) and (24) for the output signals are, analogous to equations (1) and (2):

$$U_{out3} = TP_3 * U_{in0} = \frac{1}{(1 + j\omega c)} * U_{in0} \qquad (23)$$

$$U_{out4} = HP_3 * U_{in90} = \frac{j\omega c}{(1 + j\omega c)} * U_{in90} \qquad (24)$$

Criteria for an ideal mirror suppression are: $U_{out3}$ and $U_{out4}$ have the same amplitude and are shifted 180° in phase with respect to each other. Since $U_{in0}$ and $U_{in90}$ are already 90° shifted in phase with respect to each other and the numerator of equation (23) is purely real and the numerator of equation (24) is purely imaginary, the criterion of $\Delta\phi=180°$ is fulfilled at the same denominator. Amplitude equality is, however, only achieved once, as is shown by the amplitude characteristic in FIG. 18.

If this circuit arrangement 2, 3 for phase shifting in accordance with FIGS. 2 and 3 is part of a mirror suppression circuit 8, 9 in accordance with FIGS. 8 and 9, only one mirror frequency is suppressed rather than the whole mirror frequency band. The transfer function is shown by way of a broken-line curve in FIG. 21.

Figure 10:
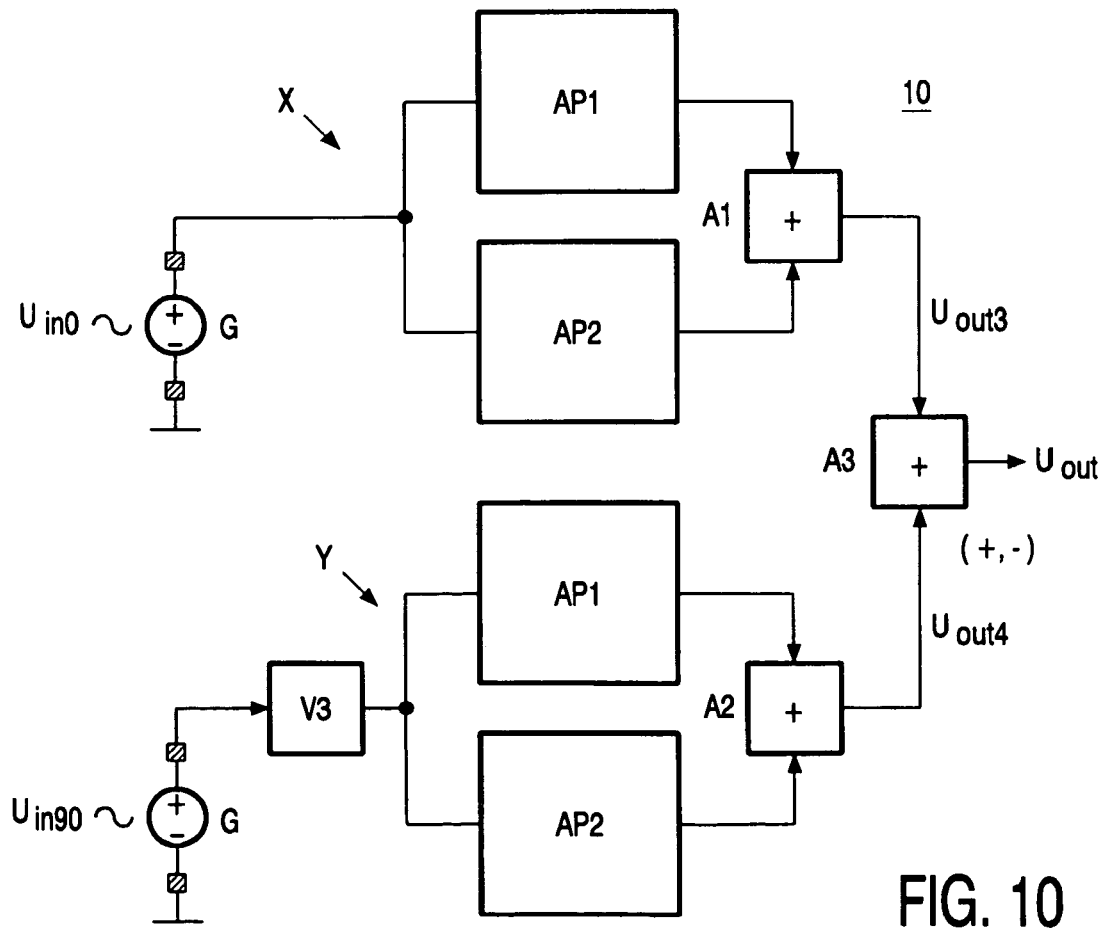

FIG. 10 shows the application of the solution according to the invention, as shown in FIG. 3, in a mirror frequency suppression circuit 10. The branching point Z of the circuit arrangement 3 in this Figure is cut off. The input signal $U_{in0}$ is now fed to the upper branch and supplied at a branching point X, while the input signal $U_{in90}$ is fed to the lower branch and supplied to an amplifier element $V_3$ and subsequently at the branching point Y.

Equations (25) and (26) for the output voltages are, analogous to equations (5) and (6):

$$U_{out3} = (AP_1 - AP_2) * U_{in0} = \frac{2j\omega(b-a)}{(1+j\omega a)(1+j\omega b)} * U_{in0} \quad (25) \approx 2*(11)$$

$$U_{out4} = (AP_1 + AP_2) * U_{in90} = \frac{2(1+\omega a\omega b)}{(1+j\omega a)(1+j\omega b)} * U_{in90} \quad (26) \approx 2*(10)$$

The amplitude characteristic is also shown in FIG. 19.

Likewise as in the state of the art in accordance with FIG. 8 or 9, the output signals $U_{out3}$ and $U_{out4}$ are combined via an adder $A_3$ or a subtracter, respectively. Equation (27) describes the output signal $U_{out}$.

$$U_{out} = U_{out3}[G1.(25)] \pm U_{out4}[G1.(26)] \quad (27)$$
$$= U_{in0}(AP_1 - AP_2) \pm U_{in90}(AP_1 + AP_2)$$

Figure 15:
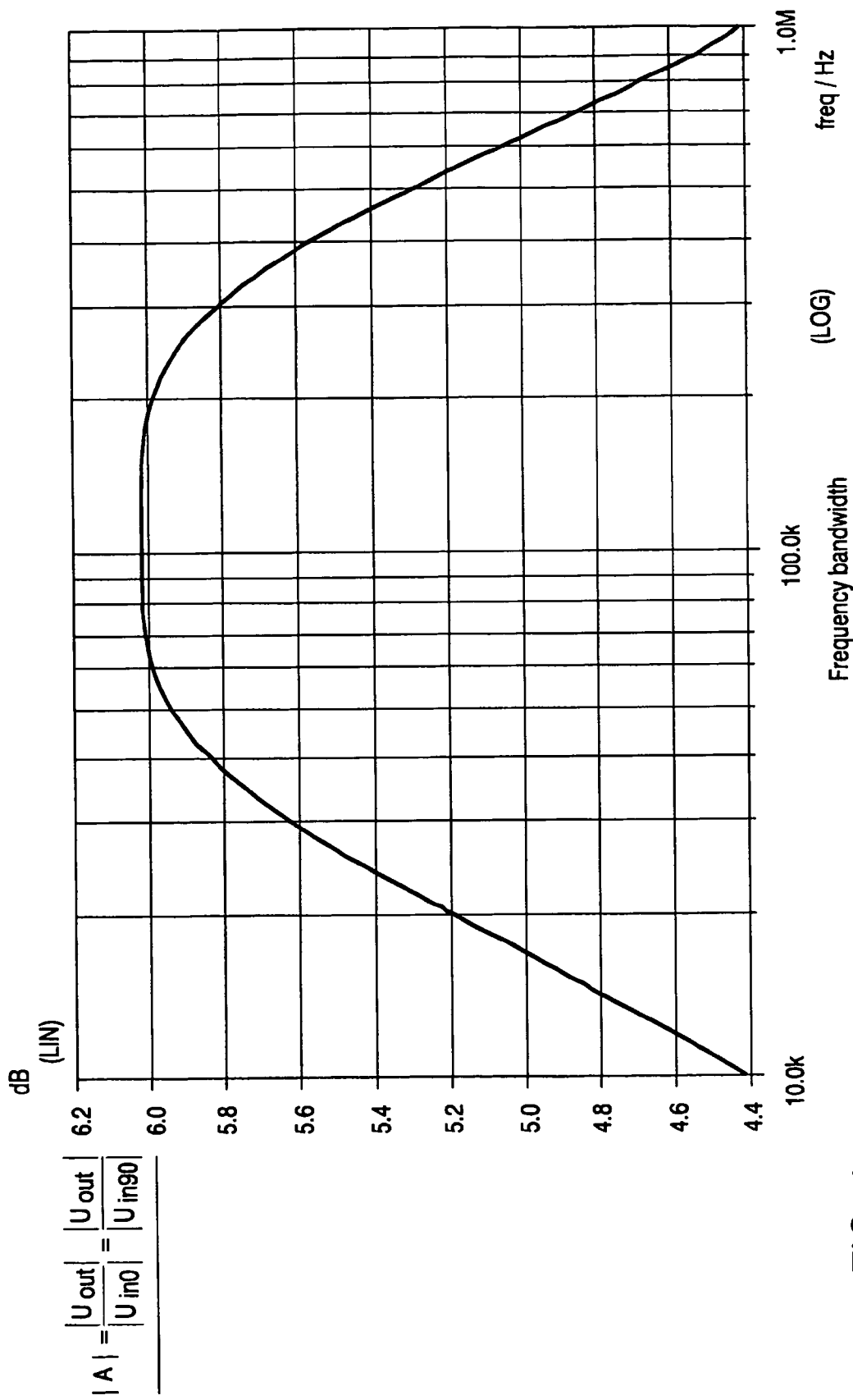
FIG. 15 shows the gain transfer function.
Figure 21:
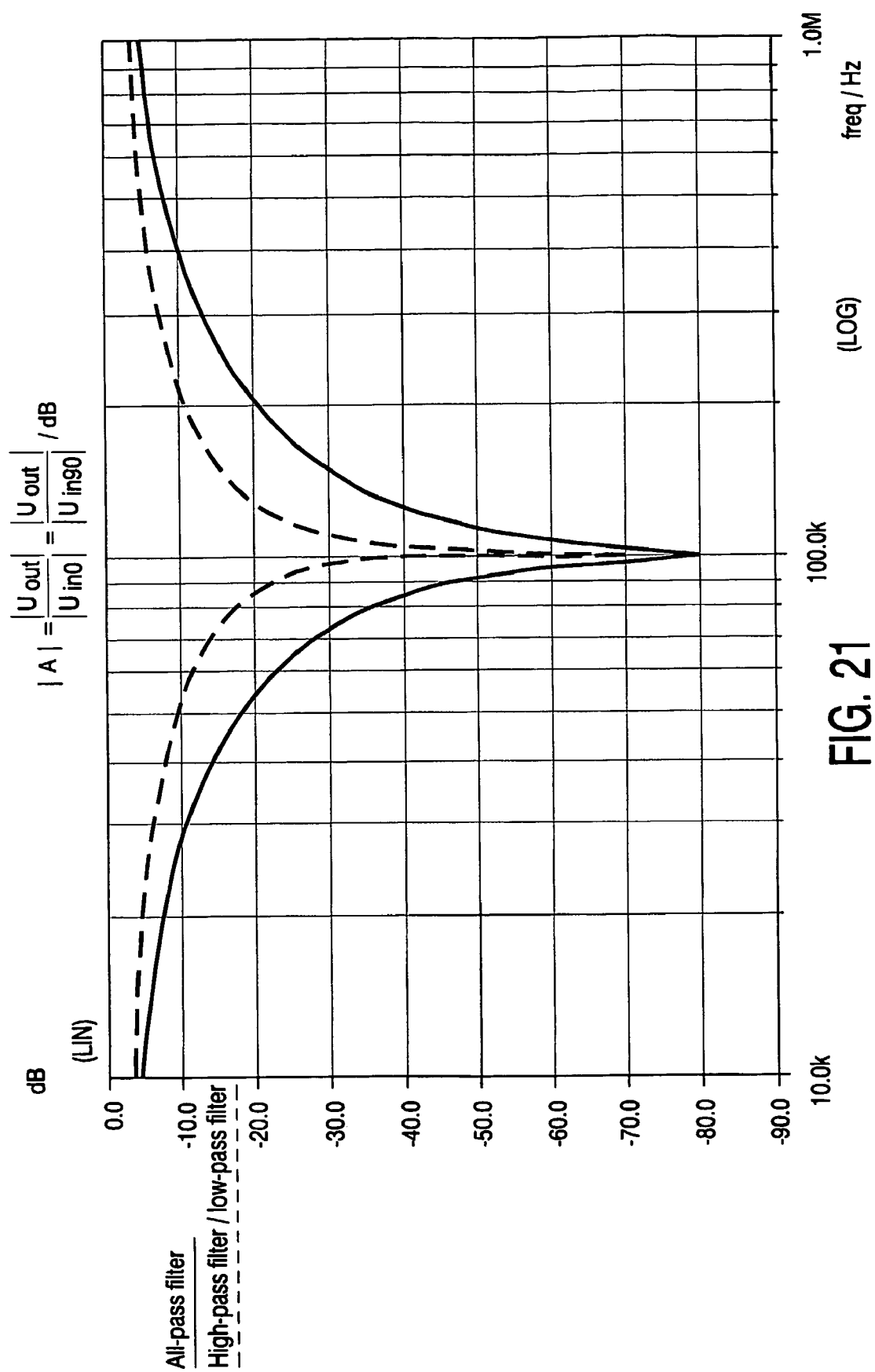
FIG. 21 is the prior-art diagram showing the transfer function with only one blanking point.

Dependent on the sign of the phase difference $\Delta\phi$ between $U_{in0}$ and $U_{in90}$, the transfer function of the output signal corresponds to that shown in FIG. 15 or to the solid-line curve in FIG. 21.

Figure 11:
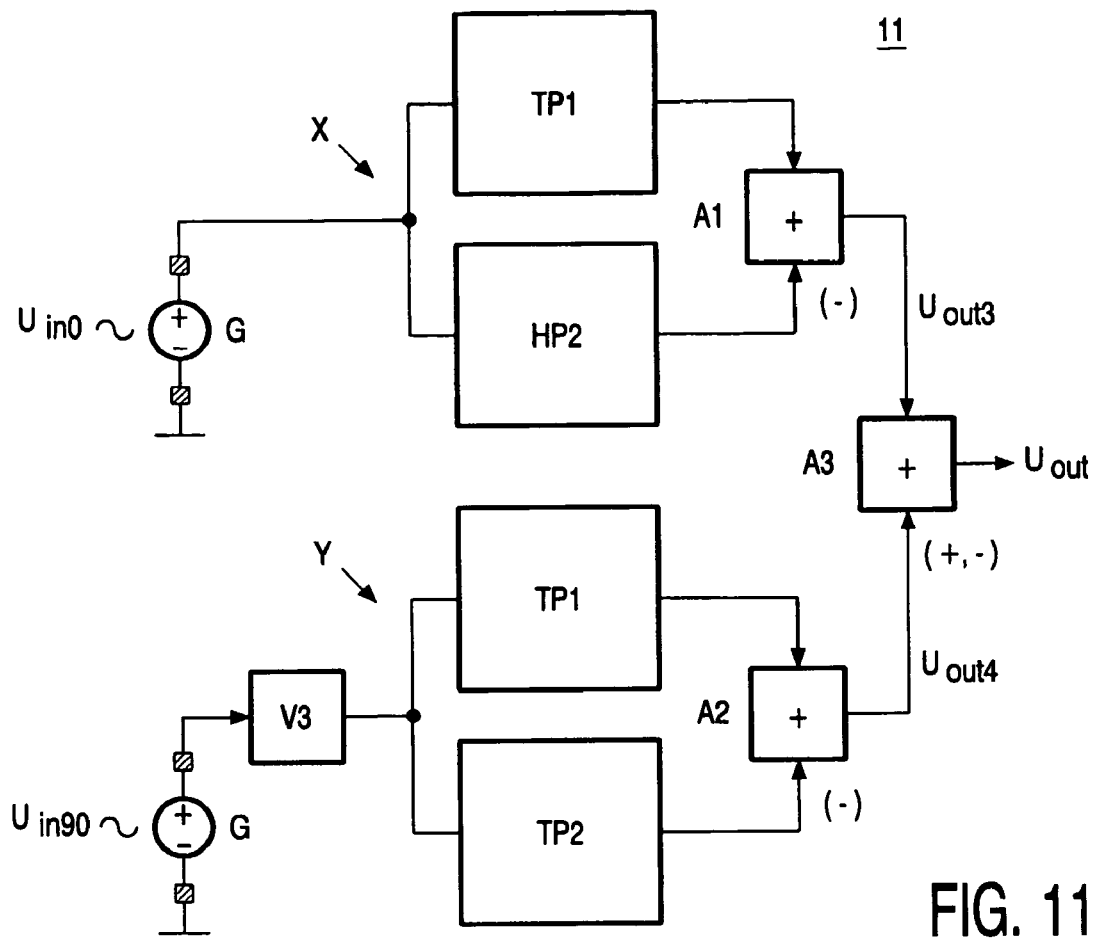

FIG. 11 shows a circuit arrangement 111 in an application of the solution according to the invention as shown in FIG. 4. For the signals $U_{in0}$, $U_{in90}$ and $U_{out}$, the same applies as for FIG. 10. Equations (28) and (29) for output signals $U_{out3}$ and $U_{out4}$ are, analogous to FIG. 4, for the gain A=1 of the amplifier element $V_3$:

$$U_{out3} = (TP_1 - HP_2) * U_{in0} = \frac{(1+\omega a\omega b)}{(1+j\omega a)(1+j\omega b)} * U_{in0} \quad (28) \approx (10)$$

$$U_{out4} = (TP_1 - TP_2) * U_{in90} = \frac{j\omega(b-a)}{(1+j\omega a)(1+j\omega b)} * U_{in90} \quad (29) \approx (11)$$

FIG. 19 shows the amplitude characteristic for both $U_{out1}$ and $U_{out2}$ of FIGS. 3 and 4, and also for $U_{out3}$ and $U_{out4}$ of FIG. 11.

Equation (30) for the output signal $U_{out}$ is:

$$U_{out} = U_{out3}[G1.(28)] \pm U_{out4}[G1.(29)] \quad (30)$$
$$= U_{in0}(TP_1 - HP_2) \pm U_{in90}(TP_1 + TP_2)$$

Figure 22:
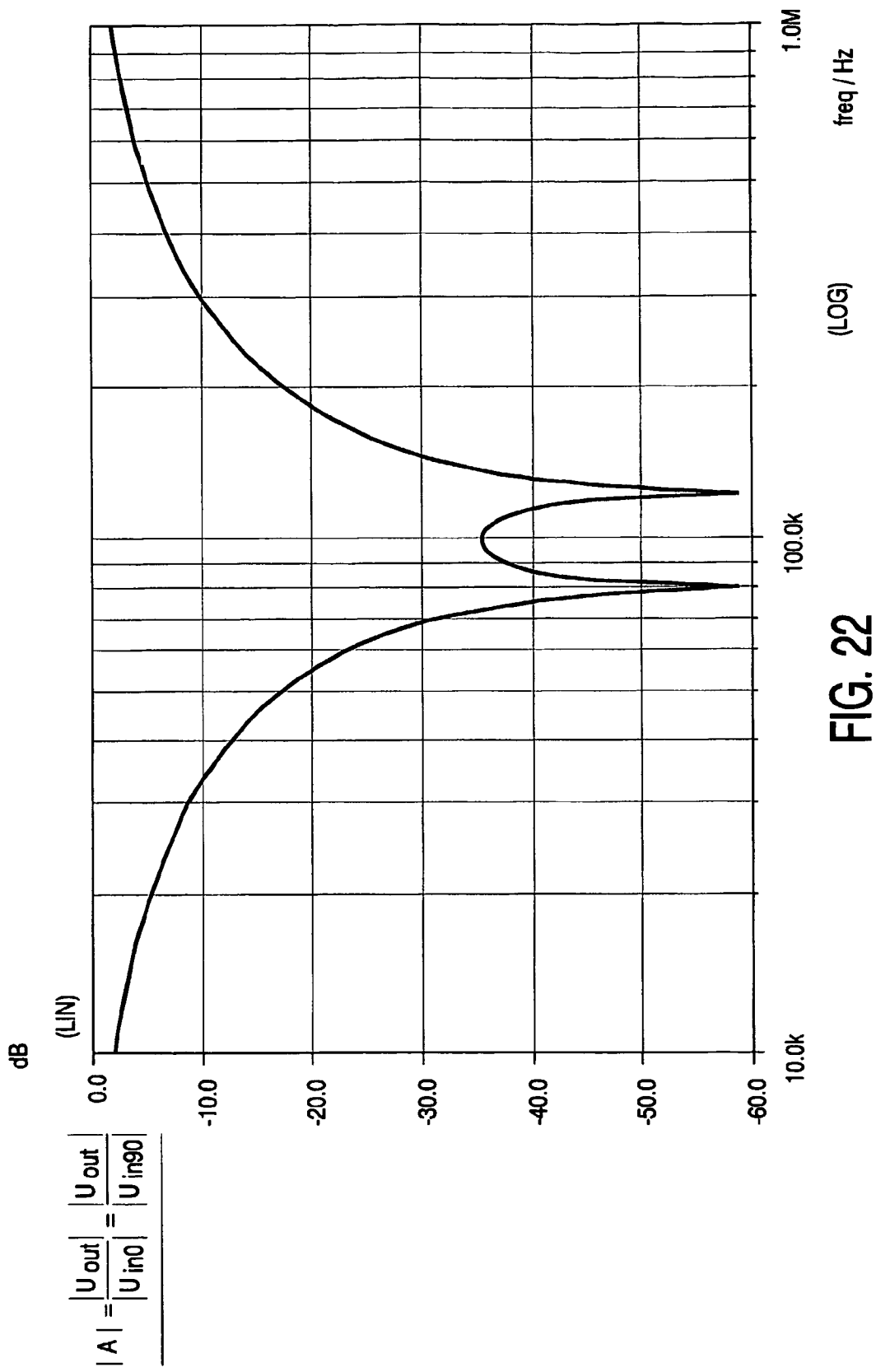
FIG. 22 is the prior-art diagram showing the transfer function with two blanking points.

Dependent on the sign of the adder $A_3$, the transfer function is in accordance with FIG. 22 or FIG. 15.

Figure 12:
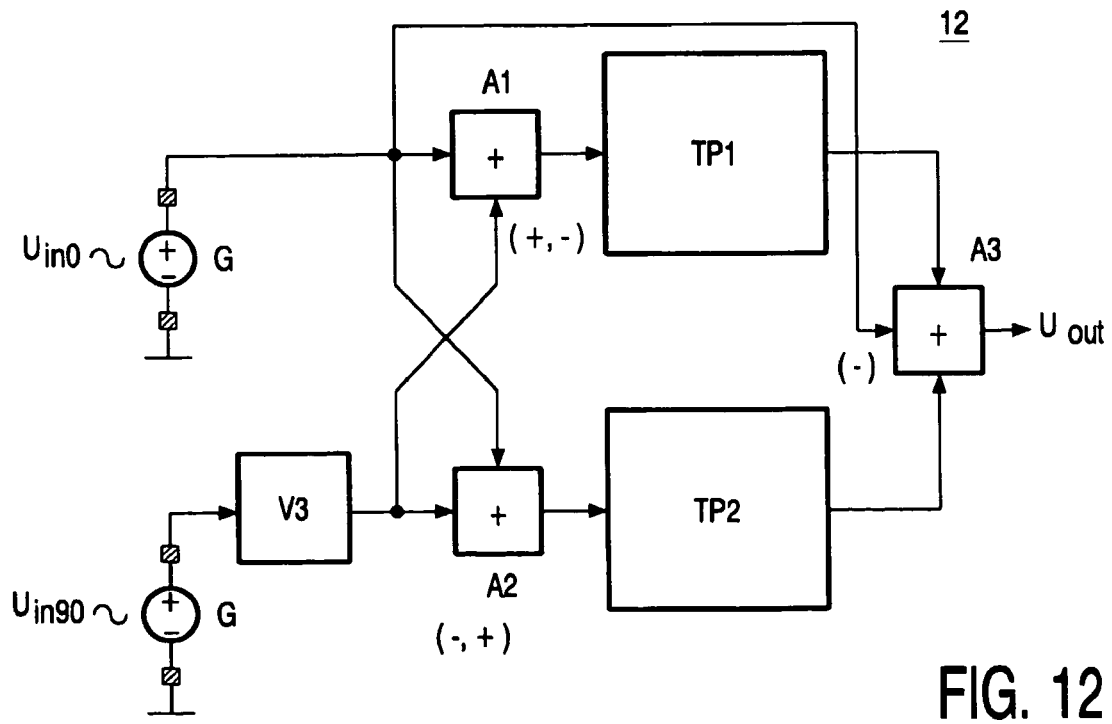

The circuit arrangement 12 shown in FIG. 12 is obtained when the high-pass filter $HP_2$ in FIG. 11 is substituted by equation (31)

$$HP_2 = 1 - TP_2 \quad (31)$$

Equation (32) for the output voltage $U_{out}$ for the gain A=1 of the amplifier element $V_3$ is:

$$U_{out} = U_{out3} \pm U_{out4} \quad (32)$$
$$= U_{in0}(TP_1 - HP_2) \pm U_{in90}(TP_1 - TP_2)$$
$$= U_{in0}(TP_1 - (1 - TP_2)) \pm U_{in90}(TP_1 - TP_2)$$
$$= TP_1(U_{in0} \pm U_{in90}) + TP_2(U_{in0} \mp U_{in90}) - U_{in0}$$

Again dependent on the sign of the adder $A_3$, the transfer functions relate to FIG. 15 or FIG. 21. $U_{out3}$ and $U_{out4}$ cannot be tapped in this variant.

Figure 13:
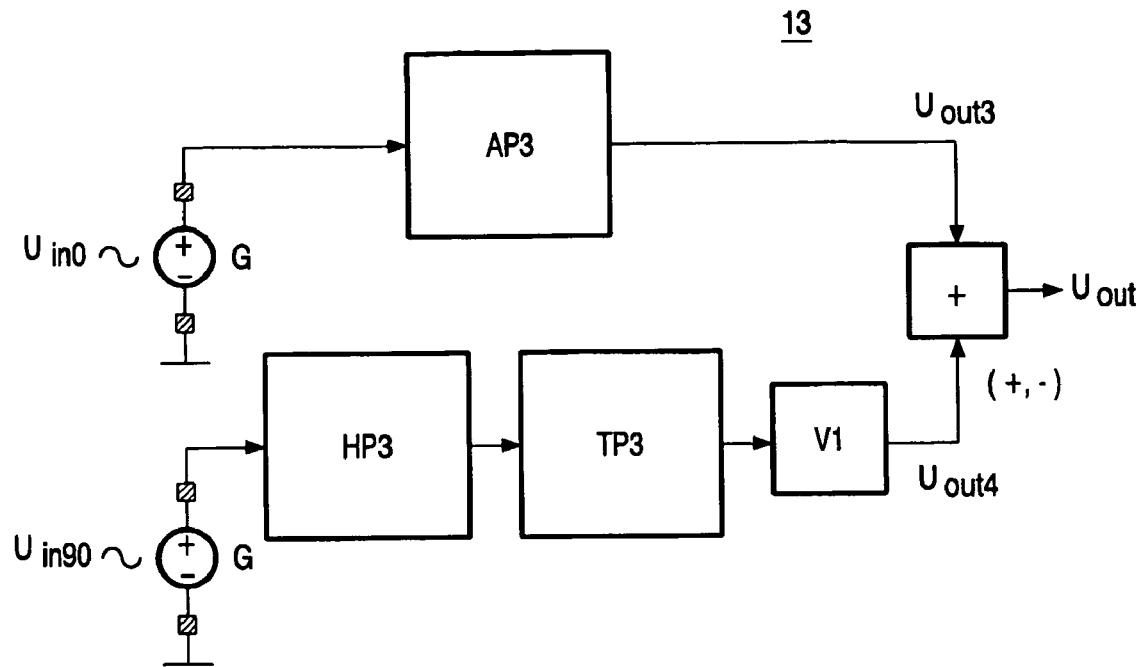

In FIG. 13, the circuit arrangement 5 shown in FIG. 5 is used as a mirror frequency suppression circuit 13. Again, an input signal $U_{in0}$ is fed to one branch and an input signal $U_{in90}$ is fed to the other branch. As described above, the output signal $U_{out}$ is formed by addition or subtraction of $U_{out3}$ and $U_{out4}$. Analogous to equations (15) and (16), equations (33) and (34) describe the output signals $U_{out3}$ and $U_{out4}$ for the gain A=2 of the amplifier element $V_1$:

$$U_{out3} = AP_3 * U_{in0} = \frac{(1+\omega c\omega c)}{(1+j\omega c)(1+j\omega c)} * U_{in0} \quad (33) \approx (15)$$

$$U_{out4} = 2 * TP_3 * HP_3 * U_{in90} = \frac{2j\omega c}{(1+j\omega c)(1+j\omega c)} * U_{in90} \quad (34) \approx (16)$$

The amplitude characteristic is shown in FIG. 20.

Equation (35) for the output signal $U_{out}$ is:

$$U_{out} = AP_3 * U_{in0} \pm 2 * HP_3 * TP_3 * U_{in90} \quad (35)$$

Dependent on the sign of the adder, the transfer function is shown in FIG. 15 and in FIG. 21 for A=2 and in FIG. 22 for A>2.

The arrangement shown in FIG. 13 consists of filters having equal cut-off frequencies so that advantages as compared with the other circuit arrangements are obtained, namely integration with a higher accuracy on a smaller surface.

Figure 14:
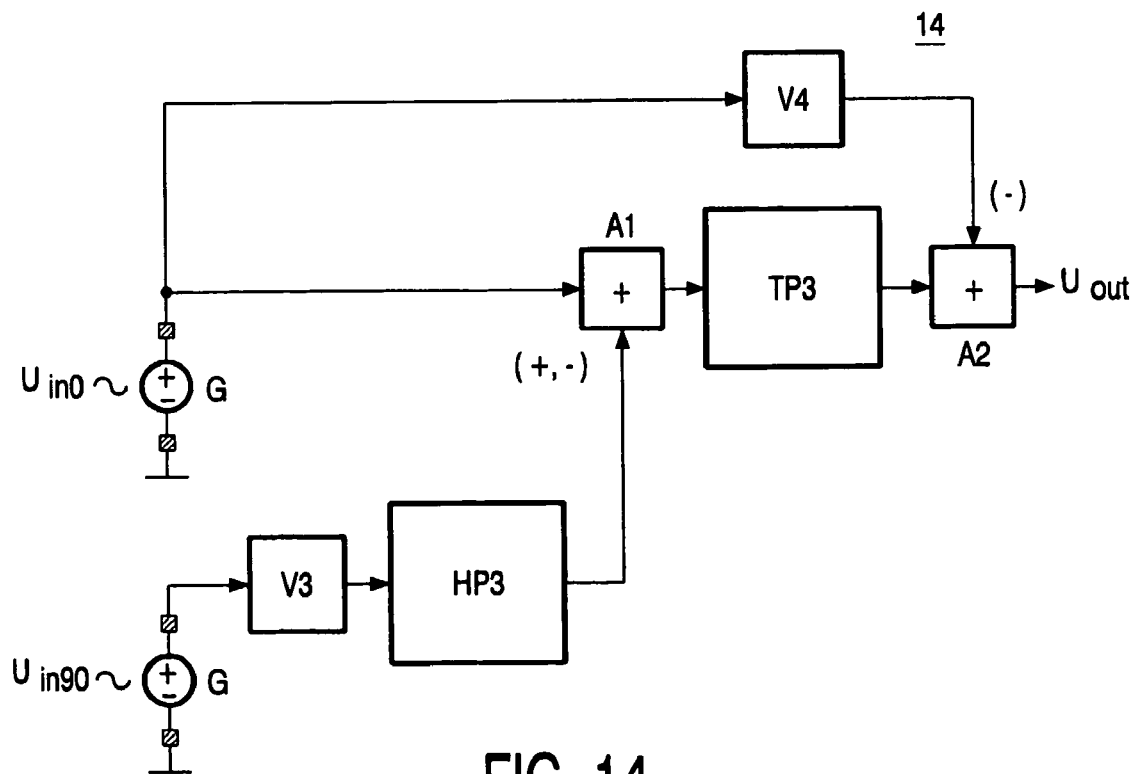

FIG. 14 is obtained when the all-pass filter $AP_3$ in equation (35) is substituted by equation (36).

$$AP_3 = 2 * TP_3 - 1 \quad (36)$$

This results in equation (37) for the output voltage for the gain A=1 of the amplifier element $V_3$ and the gain A=0.5 of the amplifier element $V_4$:

$$U_{out} = TP_3 * (2 * U_{in0} \pm 2 * HP_3 * U_{in90}) - U_{in0} \quad (37)$$

Since voltage dividers consisting of resistors can be realized more easily and at lower cost than amplifier elements, equation (37) is halved so that the circuit arrangement 14 shown in FIG. 14 is obtained in accordance with equation (38).

$$\frac{U_{out}}{2} = TP_3 * (U_{in0} \pm HP_3 * U_{in90}) - \frac{1}{2} * U_{in0} \quad (38)$$

The modulation of the input signal is maintained. Dependent on the sign of the adder $A_2$, the characteristic shown in FIG. 15 and in FIG. 21, the solid-line curve, is obtained for the transfer function for A=1 and in FIG. 22 for A>1. The embodiment according to the invention, shown in FIG. 14, can be more easily realized as a circuit because of the same cut-off frequency of the high-pass filter and the low-pass filter as compared with the prior art, shown in FIG. 8, using two all-pass filters with different cut-off frequencies. The arrangement shown in FIG. 14 can be integrated with greater accuracy on a smaller surface.

The diagram in FIG. 15 shows the transfer function in the case of amplification of the output signal with respect to the down-converted input signal. The gain is plotted in dB with respect to the frequency. Equation (39) of the curve shown is generally:

$$|A| = \frac{|U_{out}|}{|U_{in0}|} = \frac{|U_{out}|}{|U_{in90}|} \quad (39)$$

for $\Delta\alpha=+90°$.

The base frequency of 100 kHz chosen in this embodiment forms the center of a frequency band ranging from about 10 kHz to about 1 MHz.

The diagram in FIG. 15 relates to the circuit arrangements shown in FIGS. 10, 11, 12, 13 and 14.

The diagram in FIG. 16 shows the phase variation of the all-pass filter $AP_1$ with a cut-off frequency $f_{90}$ of 41.4 kHz and all-pass filter $AP_2$ with a cut-off frequency $f_{90}$ of 242 kHz, as assumed in accordance with FIG. 1. Furthermore, the phase difference $$\Delta f = AP_1 - AP_2 \quad (40)$$

is plotted. It can clearly be seen that the value of the phase difference is 90° only for the one frequency of 100 kHz. FIG. 16 shows that the phase difference of the circuit arrangement shown in FIGS. 1 and 8, as compared with the prior art, is not frequency-constant.

The diagram in FIG. 17 shows how two frequencies are achieved in the prior art according to FIG. 1, for which the phase difference is 90°. This is achieved by choosing a smaller cut-off frequency $f_{90}$ for all-pass filter $AP_1$ than in FIG. 16 and a slightly higher cut-off frequency $f_{90}$ for all-pass filter $AP_2$. When the circuit arrangement for phase shifting is part of a mirror frequency suppression circuit, the frequencies at which the phase difference is 90° are important because disturbing signals are blanked at these frequencies only. At frequencies directly above or below this value, there is only an attenuation. The diagram in FIG. 21 represents the suppression in dB with respect to the frequency. The transfer function shown by way of a broken line relates to FIG. 9 while the transfer function shown by way of a solid line relates to FIG. 8. It can clearly be seen that blanking is effected at the frequency of 100 kHz in the chosen example. Above and below this frequency, the attenuation will be smaller, while the circuit arrangement with all-pass filters (solid line) effects a better attenuation. The diagram in FIG. 22 represents the transfer function for an arrangement as shown in FIG. 17. Practice has proved that an attenuation of more than 28 dB is sufficient. As regards the function shown, this means that the frequency band is adequately suppressed between about 70 kHz and about 130 kHz.

Mirror suppression circuits are used in, for example, radio receivers. In this case, the received signal does not consist of a single reception frequency but of a frequency band. In accordance with the received useful band, a mirror frequency band is generated in the mixer stages. With regard thereto, a suppression as shown in the diagram in FIG. 21 is not adequate but should possibly have the variation of the transfer functions in the diagram shown in FIG. 22.

In the diagram shown in FIG. 18, the amplitude characteristic is shown in dB with respect to the frequency in Hz for the circuit arrangement of the prior art as shown in FIG. 9 and in FIG. 2 (wherein HP was substituted for the function (1-TP)). The solid line relates to the low-pass filter and the broken line relates to the high-pass filter. Based on the examples, equations (41) and (42) for the amplitude characteristic are then:

$$|A(TP)| = \left|\frac{U_{out1}}{U_{in}}\right| = \left|\frac{U_{out3}}{U_{in0}}\right| \quad (41)$$

$$|A(HP)| = \left|\frac{U_{out2}}{U_{in}}\right| = \left|\frac{U_{out4}}{U_{in90}}\right| \quad (42)$$

It can clearly be seen that the two amplitudes have only one point of intersection, namely at the base frequency of 100 kHz chosen as an example. For an amplitude difference of 6 dB, the marked frequency band of 50 kHz to 200 kHz is obtained in this example.

In the diagram shown in FIG. 19, the amplitude characteristic is shown in dB with respect to the frequency in Hz for the circuit arrangement according to the invention, as shown in FIGS. 3, 4, 7, 10 and 11. Both amplitude characteristics are again equal at the base frequency of 100 kHz. However, the difference is that the amplitude difference of 6 dB results in a wider frequency band, in this example a frequency band of about 27 kHz to 373 kHz. Equations (43) and (44) describe the attenuation in the upper and lower branch of the circuit arrangement.

$$|A(\text{1st branch})| = \left|\frac{U_{out1}}{U_{in}}\right| = \left|\frac{U_{out3}}{U_{in0}}\right| \quad (43)$$

$$|A(\text{2nd branch})| = \left|\frac{U_{out2}}{U_{in}}\right| = \left|\frac{U_{out4}}{U_{in90}}\right| \quad (44)$$

The diagram in FIG. 20 shows the amplitude characteristic in dB with respect to the frequency in Hz for a circuit arrangement according to the invention, as shown in FIGS. 5, 6 and 13. The amplitude equality again occurs at the chosen base frequency of 100 kHz. The frequency band limited by the 6 dB amplitude difference is as wide as that in FIG. 19, namely from about 27 kHz to about 373 kHz.

FIG. 21 shows, in accordance with the prior art, a diagram of the transfer function $$|A| = \left|\frac{U_{out}}{U_{in0}}\right| = \left|\frac{U_{out}}{U_{in90}}\right| \quad (45)$$

for $\Delta\alpha=-90°$ with only one blanking. This blanking is also referred to as notch and occurs when the two amplitudes of $U_{out3}$ and $U_{out4}$ are equal. The transfer function shown by way of a broken line corresponds to $U_{out}$ in FIG. 9, i.e. to the prior art, with a high-pass filter and a low-pass filter having the same cut-off frequency. The transfer function shown by way of a solid line corresponds to the output signal $U_{out}$ of FIG. 8, i.e. the circuit arrangement with two all-pass filters. When it is assumed that the suppression should be at least minus 28 dB or less, only a narrow segment as a frequency band is obtained for the mirror suppression with the high-pass/low-pass filter arrangement. For the circuit arrangement with all-pass filters in accordance with the prior art, a frequency band of about 70 to 120 kHz, i.e. about 50 kHz wide is obtained.

FIG. 22 shows, in accordance with the prior art, a diagram with the transfer function having two notches. The notches are shifted to above and below the base frequency. In between, the transfer function increases. It remains of course at a value which is smaller than minus 28 dB, which has proved to be the limit value for the practical embodiment. Equation (45) for the transfer function has been described above. The diagram in FIG. 22 relates to the circuit arrangements shown in FIG. 10 with a gain A>1 for $V_3$, FIG. 11 with a gain A>1 for $V_3$, FIG. 12 with a gain A>1 for $V_3$, FIG. 13 with a gain A>2 for $V_1$ and FIG. 14 with a gain A>1 for $V_3$.

Figure 23:
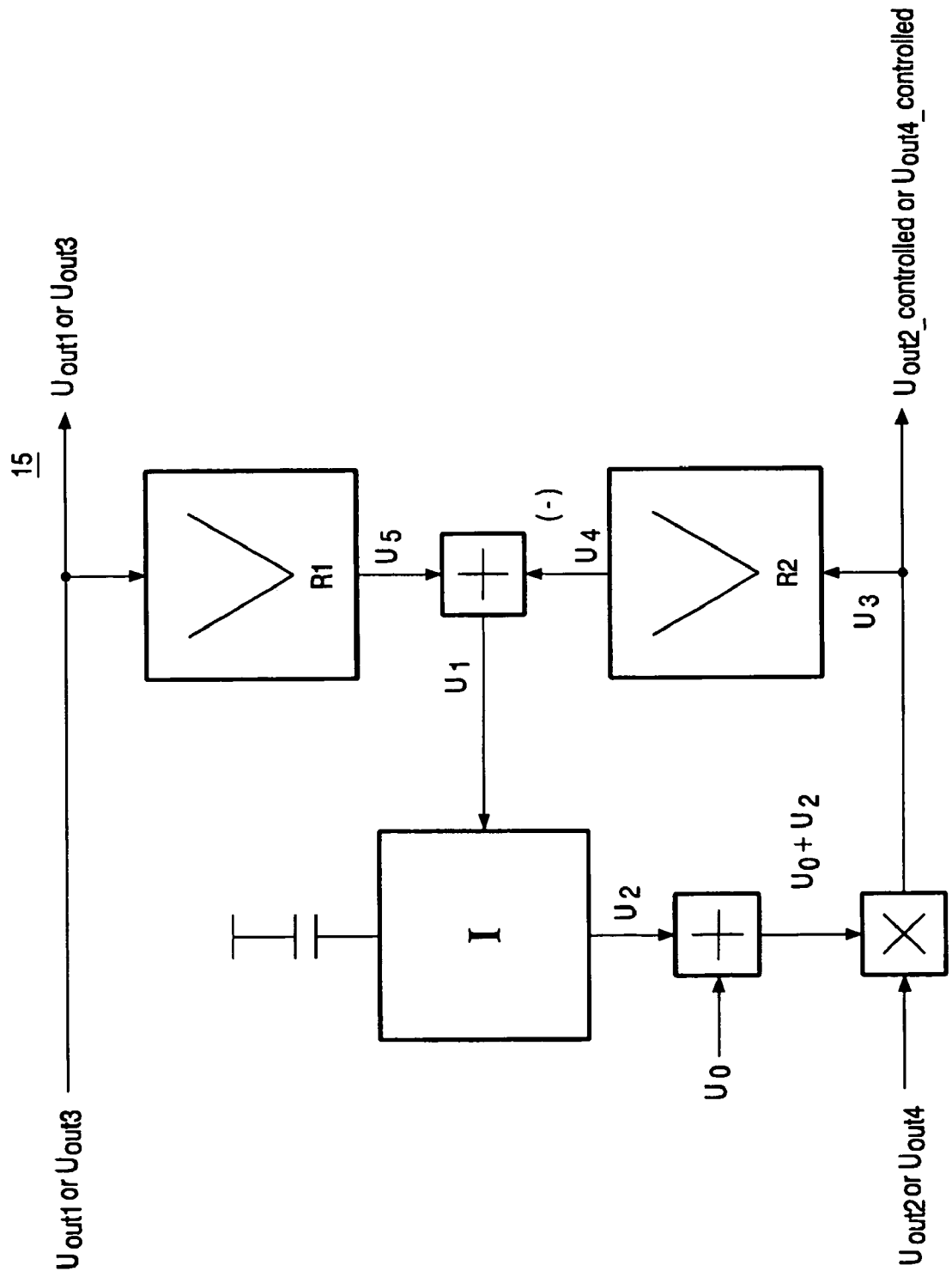
FIG. 23 is a block diagram of the amplitude matching according to the invention.

FIG. 23 is a block diagram for amplitude matching of two mutually phase-shifted signals. The phase difference is preferably 90° or 180°. The amplitude matching is effected by only measuring one signal and further supplying it in an unchanged form, and by measuring and controlling the other signal. Both amplitudes are matched as far as their values are concerned so that the difference is very small or substantially 0. This block diagram may be used, for example, behind a circuit arrangement for phase shifting, as is shown in FIGS. 2 to 7. The two output signals $U_{out1}$ and $U_{out2}$ of the phase shifters would be the two mutually 90° shifted signals in this case. Due to the amplitude matching shown in FIG. 23, the amplitude deviation, generated by using filters in the branches, is quasi-compensated. For example, an amplitude deviation in one branch due to the attenuation occurs as a consequence of using a high-pass filter or a low-pass filter, or two parallel-arranged all-pass filters with different cut-off frequencies. Amplitude deviation thus occurs, for example, in phase shifters in accordance with FIGS. 2 to 7. However, the circuit arrangement shown in FIG. 23 may also be used for improving the mirror frequency suppression of a circuit arrangement as shown in FIGS. 9, 10, 11 and 13. In this case, the two 180° phase-shifted input signals are the signals $U_{out3}$ and $U_{out4}$ from a circuit for suppressing the mirror frequency. $U_{out3}$ and $U_{out4}$ can be tapped when the adder for $U_{out}$ is quasi-separated. The two signals ($U_{out1}$ and $U_{out2}$ or $U_{out3}$ and $U_{out4}$) are initially rectified in a rectifier $R_1$, $R_2$ and the two output signals $U_5$ and $U_4$ are combined via an adder in such a way that the signal $U_4$ is subtracted from the signal $U_5$. The output signal $U_1$ of the adder is applied to an integrator I. Since the two signals which are compared with each other generally only have a minor amplitude difference, $U_1$ is generally small. The integrator comprises a low-pass filter with a very low cut-off frequency of substantially 0 and a high gain at frequencies around 0 Hz. The integrator I frees $U_1$ from the part of the signal change. The two rectifiers $R_1$, $R_2$, the adder and the integrator I quasi-form the mean value of the amplitude difference of the two signals. The output signal $U_2$ of the integrator is then a measure of the amplitude difference and is compared with a reference voltage $U_0$. This measure of the amplitude difference, together with the reference signal, forms the control value for the control element, the mixer or the multiplier which is arranged in one signal path. If the control element, as in the embodiment shown in FIG. 23, is arranged in the path of $U_{out2}$ or $U_{out4}$, the control value should increase or decrease the signal $U_{out2}$ or $U_{out4}$, respectively, i.e. it should readjust the signal until it has reached the same value as $U_{out}$, and $U_{out3}$, respectively.

This circuit arrangement for amplitude control is preferably used in connection with one of the circuit arrangements for phase shifting or mirror frequency suppression according to the invention, because there is less to readjust in this case than in the prior art. The circuit arrangement shown in FIG. 23 is relatively simple and can be realized on a small surface in a relatively accurate manner and, consequently, at low cost.

The invention claimed is:

1. A circuit arrangement which, starting from an input signal generates two 90° phase-shifted output signals, in which the input signal has a base frequency and is supplied on two parallel branches including a first branch and a second branch via a branching point, comprising:
   in the first branch:
      a first sub-branch of the first branch including a first all-pass filter having a cut-off frequency which is below the base frequency;
      a second sub-branch of the first branch including a second all-pass filter having a cut-off frequency which is above the base frequency; and
      a first adder or subtractor for combining output signals of the first all-pass filter and the second all-pass filter to produce one of the two 90° phase-shifted output signals; and
   in the second branch:
      a first sub-branch of the second branch including a third all-pass filter having a cut-off frequency which is above the base frequency;
      a second sub-branch of the second branch including a fourth all-pass filter, whose frequency is below the base frequency; and
      a second adder for combining output signals of the third all-pass filter and the fourth all-pass filter to produce another one of the 90° phase-shifted output signals.

2. A circuit arrangement as claimed in claim 1, wherein the second all-pass filter is of a same type as the third all-pass filter.

3. A circuit arrangement as claimed in claim 1, wherein the fourth all-pass filter is of a same type as the first all-pass filter.

4. A circuit arrangement as claimed in claim 1, comprising a rectifier and a subtractor for generating a difference signal between a rectified signal derived from one of the two 90° phase-shifted output signals and a rectified signal derived from another one of the two 90° phase-shifted output signals, the difference being applied to an integrator I.

5. A circuit arrangement as claimed in claim 4, comprising an adder and one of a control element, a mixer and a multiplier, wherein the integrator I generates an output signal which, together with a reference signal is supplied to the adder, an output signal of which is supplied to the control element, a mixer or a multiplier.

6. A circuit arrangement, particularly for performing a method as claimed in claim 4, wherein the control element, the mixer or the multiplier receives and forms a modified value for one of the two 90° phase-shifted output signals.

7. A circuit arrangement, particularly for performing a method as claimed in claim 4, wherein the integrator I has a low cut-off frequency and a high gain proximate to the cut-off frequency.

* * * * *